United States Patent [19]

Miyamoto

[11] Patent Number: 5,135,034
[45] Date of Patent: Aug. 4, 1992

[54] OUTER LEAD FORMING APPARATUS FOR SEMICONDUCTOR DEVICE

[75] Inventor: Mitsugu Miyamoto, Chigasaki, Japan

[73] Assignee: Kabushiki Kaisha Toshiba, Kawasaki, Japan

[21] Appl. No.: 661,294

[22] Filed: Feb. 27, 1991

[30] Foreign Application Priority Data

Feb. 28, 1990 [JP] Japan .................................. 2-47507

[51] Int. Cl.⁵ ............................................. B21F 45/00
[52] U.S. Cl. .................................................. 140/105
[58] Field of Search ............ 140/105; 29/566.2, 566.3, 29/874, 822

[56] References Cited

U.S. PATENT DOCUMENTS 4,829,669  5/1989  Nakajima ............................. 140/105
4,875,279 10/1989  Sakiadis ................................. 29/743

FOREIGN PATENT DOCUMENTS 108919  5/1988  Japan ..................................... 140/105

*Primary Examiner*—Lowell A. Larson
*Attorney, Agent, or Firm*—Finnegan, Henderson, Farabow, Garrett and Dunner

[57] ABSTRACT

An outer lead forming apparatus for a semiconductor device, includes a first die block incorporating dies for performing punching steps of a lead frame, a second die block incorporating dies for performing bending steps of leads, and convey means for conveying a workpiece from the first die block to the second die block.

11 Claims, 27 Drawing Sheets

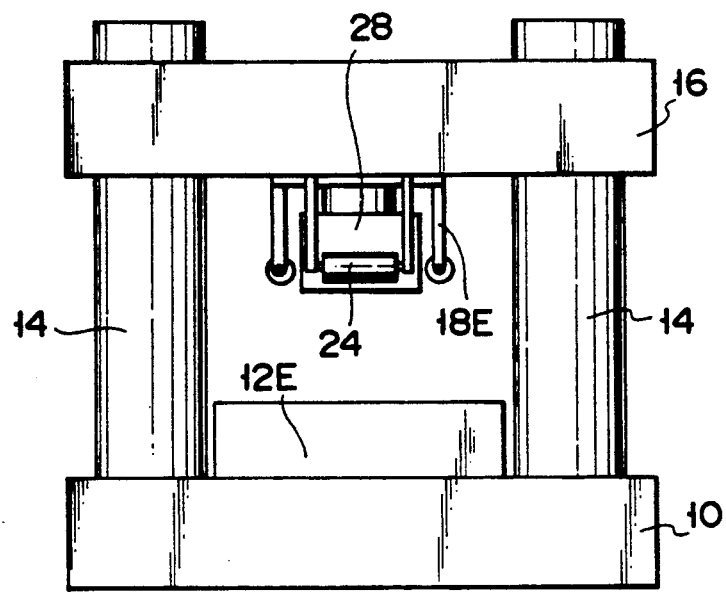
F I G. 13
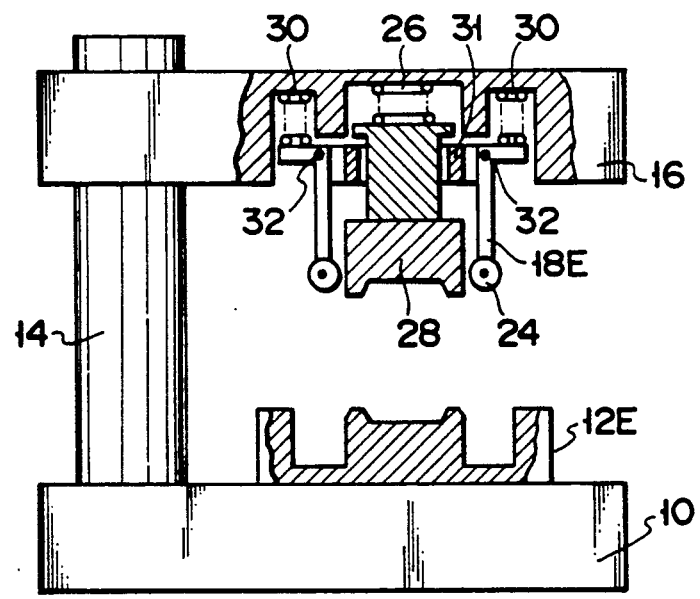
F I G. 14

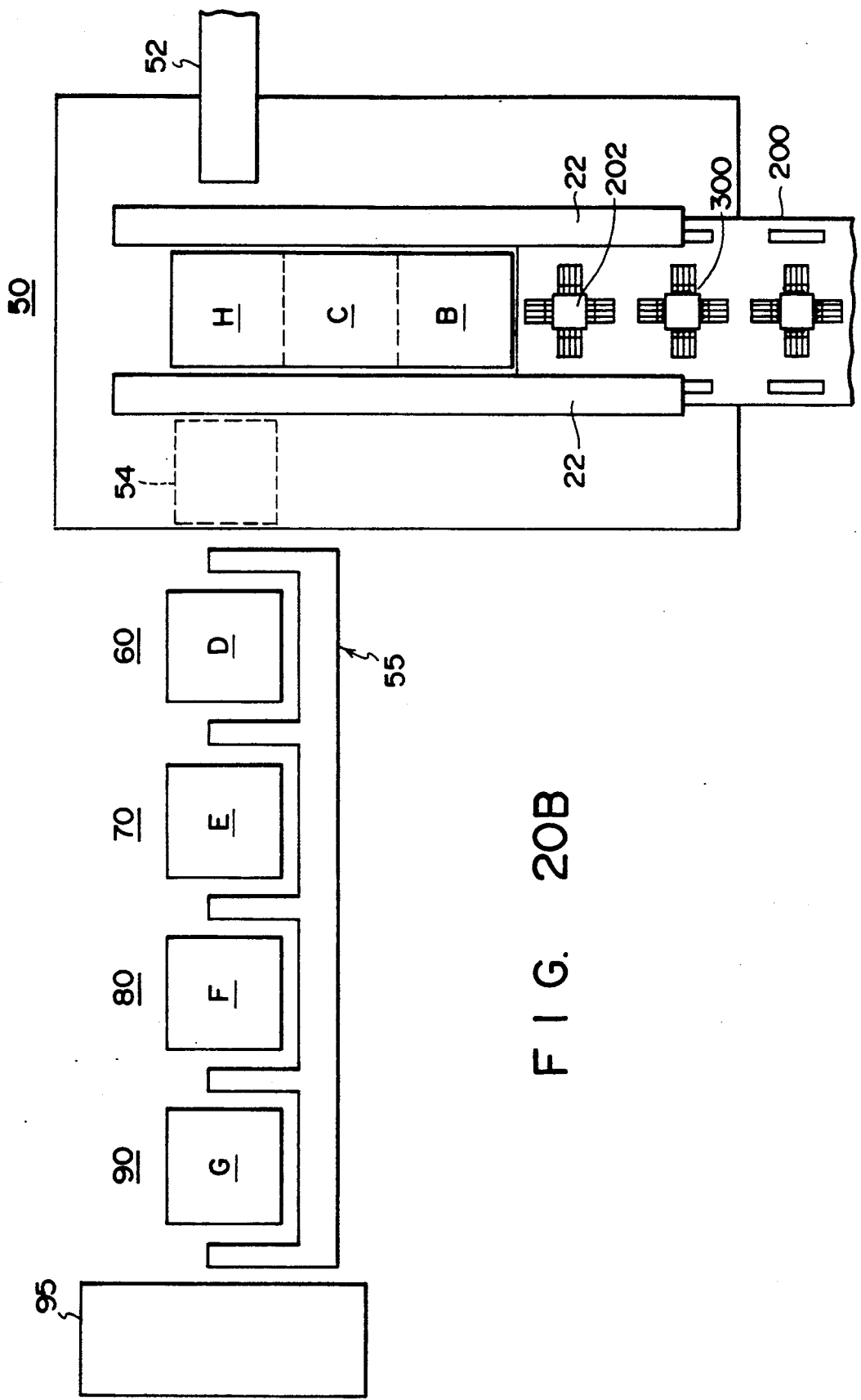
F I G. 20B

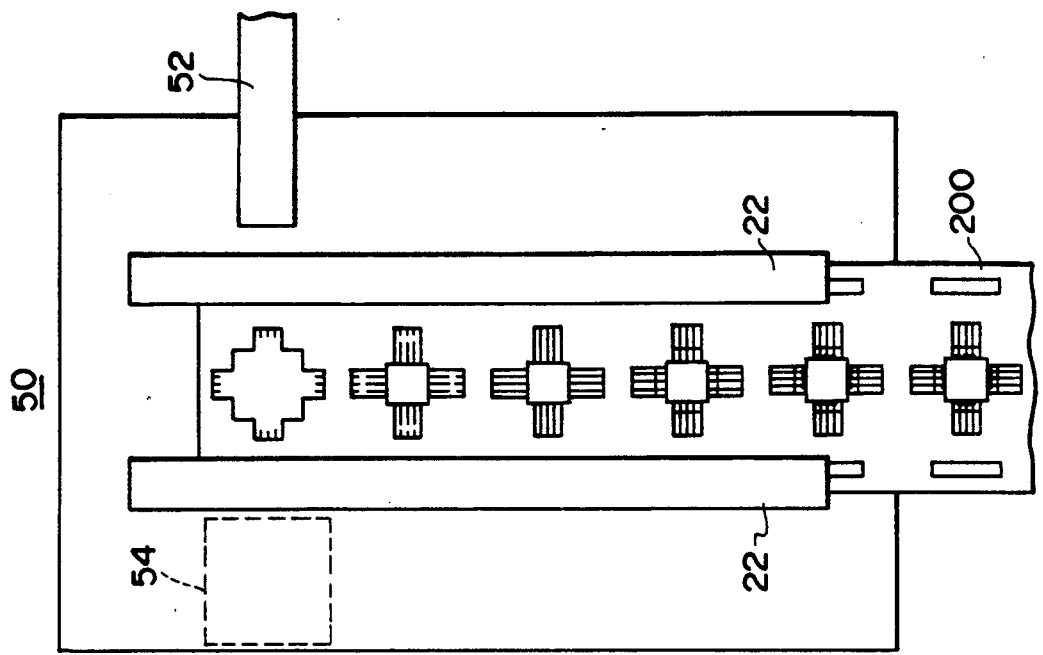
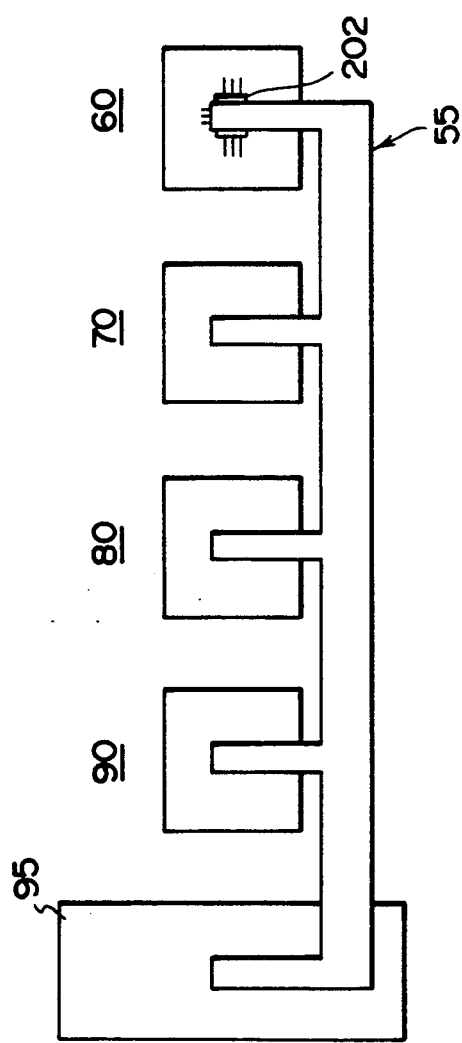
FIG. 20H

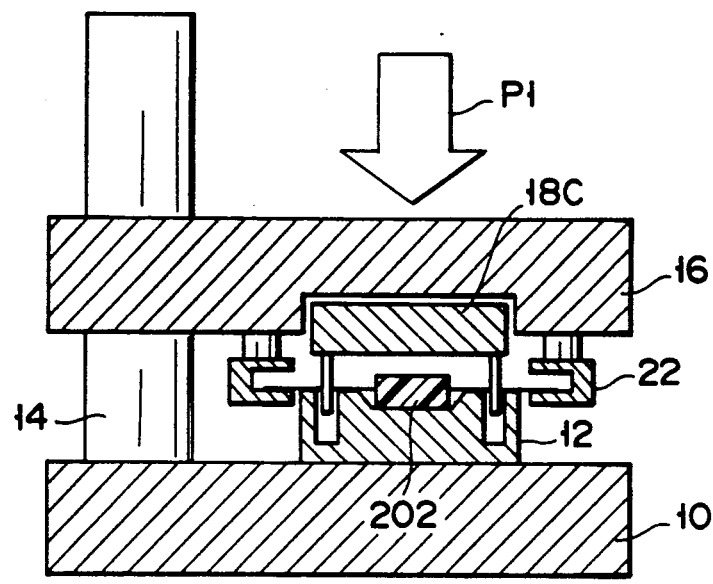
F I G. 21C
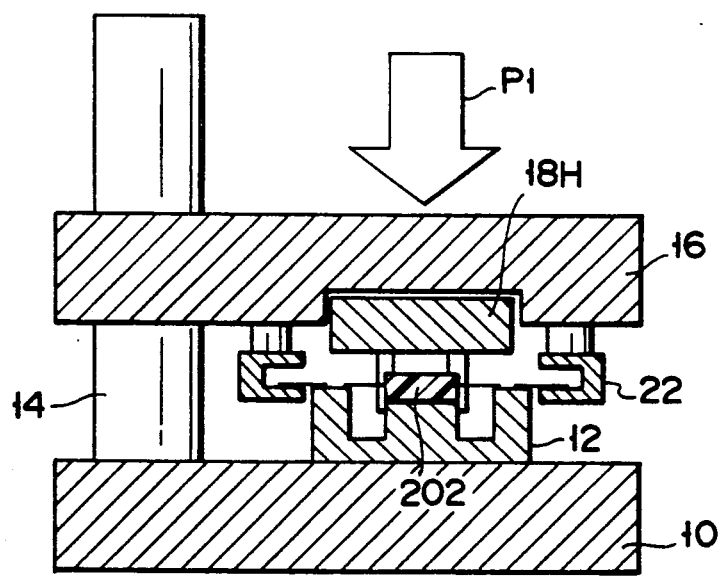
F I G. 21D

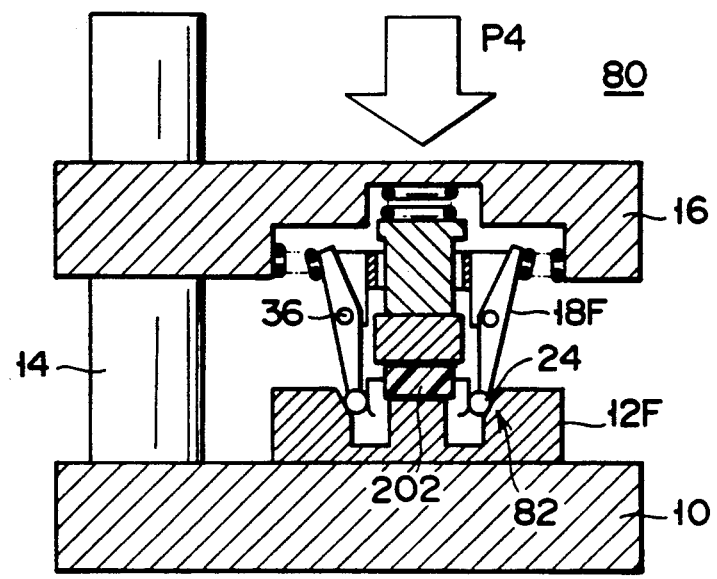
F I G. 21G
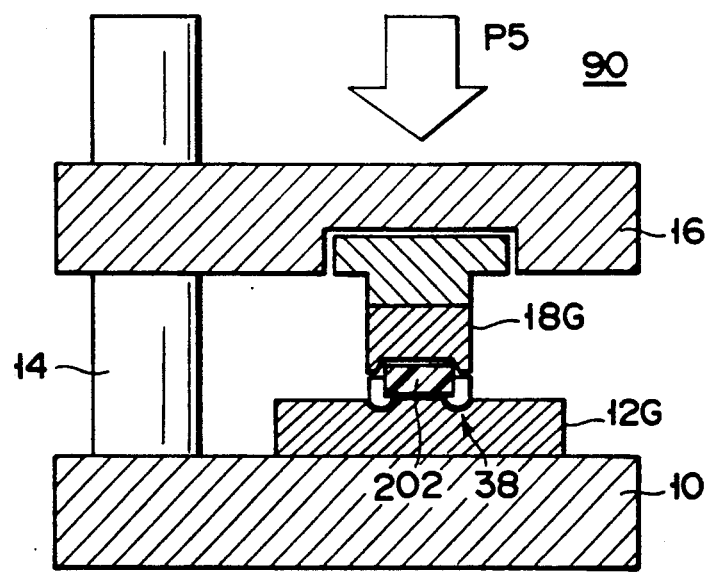
F I G. 21H

OUTER LEAD FORMING APPARATUS FOR SEMICONDUCTOR DEVICE

BACKGROUND OF THE INVENTION

1. Field of the Invention

The present invention relates to an outer lead forming apparatus for a semiconductor device and, more particularly, to a reduction in size and weight of a die of an outer lead forming apparatus.

2. Description of the Related Art

In this specification, a description of an apparatus will be made with reference to forming of the outer leads of a PLCC type semiconductor device.

Forming of the outer leads of a PLCC type semiconductor device includes the following steps.

A) Resin cut

Resin cut is the step of removing unnecessary portions of a resin used for packaging, which adhere to a lead frame (trimming).

B) Dam cut

A dam is a member, formed at an outer lead portion, for blocking a resin flowing along leads. For example, dams are formed to cross outer leads. Dam cut is the step of cutting the dams.

C) Lead cut

Lead cut is the step of separating the outer leads from the lead frame.

D) Lead end bending

Lead end bending is the step of slightly bending the distal ends of the separated outer leads. By slightly bending the distal ends of the leads, a curling direction, for example, in lead curling to be subsequently performed, is determined.

E) Lead pre-bending

Lead pre-bending is the step of pressing the outer leads by using a punch or the like and bending them by using a die, thus specifying bending portions of the outer leads.

F) Right-angle lead bending

Right-angle lead bending is the step of bending the outer leads at right angles from the bending portions specified in the step E) by using a punch and a die.

G) Lead curling

Lead curling is the step of curling the distal end portions of the outer leads. With this step, the leads are formed into J-shaped leads.

H) Tie-bar cut

A tie-bar is a member for connecting a lead frame and a semiconductor device to each other and preventing them from separating from each other. Tie-bar cut is the step of cutting this tie-bar A conventional forming apparatus includes a progressive die using a lead frame as a belt plate and performs the above-described series of steps by using a single die.

FIG. 1 is a block diagram showing schematic arrangement of a conventional forming apparatus. Referring to FIG. 1, reference symbols A to H respectively denote step blocks corresponding to the steps A) to H). Reference numerals 102 on both the sides of the step blocks A to H respectively denote convey rails for feeding a lead frame forward. The lead frame is inserted in a progressive die 100 from a direction indicated by an arrow 108 in FIG. 1. FIG. 2 is a plan view of the lead frame. Two rows of sprocket holes 201 are respectively formed along two sides of the lead frame 200. Each row of the sprocket holes 201 is formed in correspondence with the position of a corresponding convey rail 102. The lead frame 200 is fed forward in the progress die 100 by using the sprocket holes 201. A predetermined number of semiconductor devices 202 molded with a resin or the like are mounted, in a row, on an area between the two rows of the sprocket holes 201. The lead frame 200 inserted in the progressive die 100 is processed in the following manner. In the step block A), resin burrs at an outer lead portion are removed. The lead frame 200 is then fed forward, and dams are cut in the step block B). In the step block C), outer leads are cut from the lead frame 200. In the step block D), the distal ends of the outer leads are bent. In the step block E), the outer leads are further bent. In the step block F), the outer leads are bent at nearly right angles. In the step block G), the distal ends of the outer leads are curled. In the step block H), a tie-bar is cut to separate the semiconductor device 202 from the lead frame 200. The separated semiconductor device 202 is pushed by a push rod in a direction indicated by an arrow 112 so as to be fed to an unloader 114.

There are some merits in the forming apparatus having the above-described arrangement. For example, the manufacturing process can be simplified by using the progressive die and integrating all of the steps including the steps of cutting the lead frame 200 (to be referred to as punching steps hereinafter) as in the step blocks A), B), C), and H), and the steps of outer leads (to be referred to as bending steps hereinafter) as in the step blocks D), E), F), and G).

If, however, the punching steps and the bending steps are integrated, the size of the die is undesirably increased. A typical size is: length: 500 to 600 [mm]; and depth: 350 [mm]. Consequently, the die has a weight of about 80 to 100 [kg], which is too heavy for one operator to carry, thus requiring a cumbersome operation for maintenance.

In addition, a distance L between the step blocks A) to H) is determined by an arrangement pitch D between the semiconductor devices 202 on the lead frame 200. The arrangement pitch is considerably reduced to increase the yield of semiconductor devices per lead frame. For example, when PLCC type semiconductor devices are to be processed, the arrangement pitch D is set to be about 30 to 50 [mm]. Consequently, the distance L between the step blocks A) to H) is reduced. In accordance with the reduced distance L, the bending step is performed by butting a punch into a U-shaped die, i.e., so-called "butt bending". FIGS. 3A and 3B show an example of butt bending. FIGS. 3A and 3B show the step F). As shown in FIG. 3A, the semiconductor device 202 is placed between a punch 204 and a U-shaped die 206. The punch 204 is then butted into the U-shaped die 206, as shown in FIG. 3B. In this method, however, since the die 206 and leads 208 are brought into contact with other, the leads 208 tend to be damaged. Damage to the leads 208 causes a deterioration in quality of the semiconductor device. In addition, if the leads 208 are damaged, a plating (solder plating) layer of each lead is peeled off, and peeled pieces of the plating layer are left in the die. For this reason, maintenance and inspection and the like must be performed frequently. Furthermore, since the force of friction between the leads and the die is large, a gap is formed between the seal resin of the semiconductor device and the proximal end portion of each lead.

Moreover, since the bending steps and the punching steps are integrated, an unbalanced force is applied to the die. For example, in the punching steps, a large force is required to punch a lead frame. In the bending steps, however, such a large force is not required. The pressure to be applied to the die is determined in accordance with the punching steps which require a large force. For this reason, an excessive pressure is applied in the bending steps. This makes the problem of damage to leads more serious.

SUMMARY OF THE INVENTION

It is an object of the present invention to provide an outer lead forming apparatus for a semiconductor device, which allows easy maintenance of a die and can solve the problem of damage to leads.

In order to achieve the above object, there is provided outer lead forming apparatus for a semiconductor device, comprising:

a first die block incorporating dies for performing punching steps of a lead frame;

a second die block incorporating dies for performing bending steps of leads; and convey means for conveying a workpiece from the first die block to the second die block.

According to the forming apparatus having the above-described arrangement, since different dies are respectively used in the punching steps and in the ending steps, each die can be reduced in size and weight, thus allowing easy maintenance.

Since the first and second die blocks are separated from each other, optimal pressures for lead bending can be applied to the second die block. This reduces the chance of damaging leads.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 13 is a view showing a single die used in a step E;

FIG. 14 is a partial sectional view of the die in FIG. 13 viewed from a different direction;

FIGS. 20A to 20L are block diagrams showing a sequence of steps in a forming process to be performed by a forming apparatus according to an embodiment of the present invention;

FIGS. 21A to 21H are views each showing the movement of a die in each step in the forming process.

DETAILED DESCRIPTION OF THE PREFERRED EMBODIMENT

An embodiment of the present invention will be described below with reference to the accompanying drawings.

Figure 4:
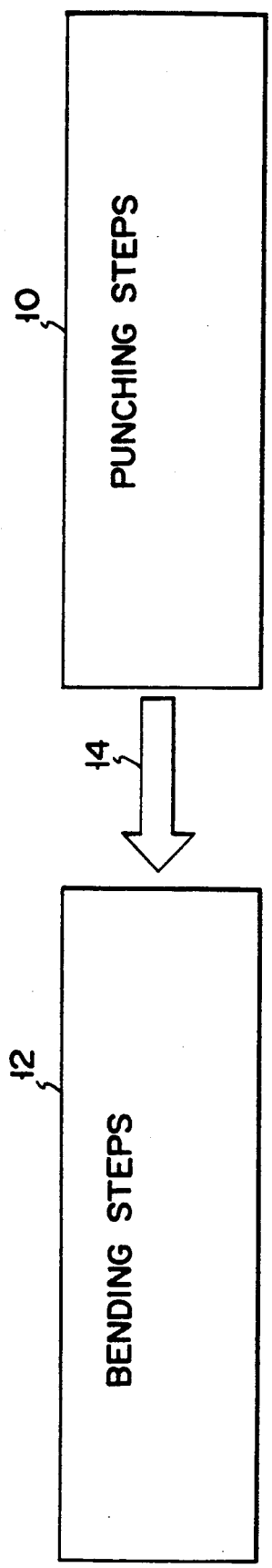
FIG. 4 is a block diagram showing a schematic arrangement of a forming apparatus according to an embodiment of the present invention.

FIG. 4 is a block diagram showing a schematic arrangement of an outer lead forming apparatus according to an embodiment of the present invention.

As shown in FIG. 4, the manufacturing block of the forming apparatus according to the present invention is divided into a punching steps block 10 for performing punching steps, and a bending steps block 12 for performing bending steps. These blocks are connected to each other through a newly added convey means 14. A workpiece, i.e., a semiconductor device, is conveyed from the punching steps block 10 to the bending steps block 12 by using the convey means 14.

Figure 5:
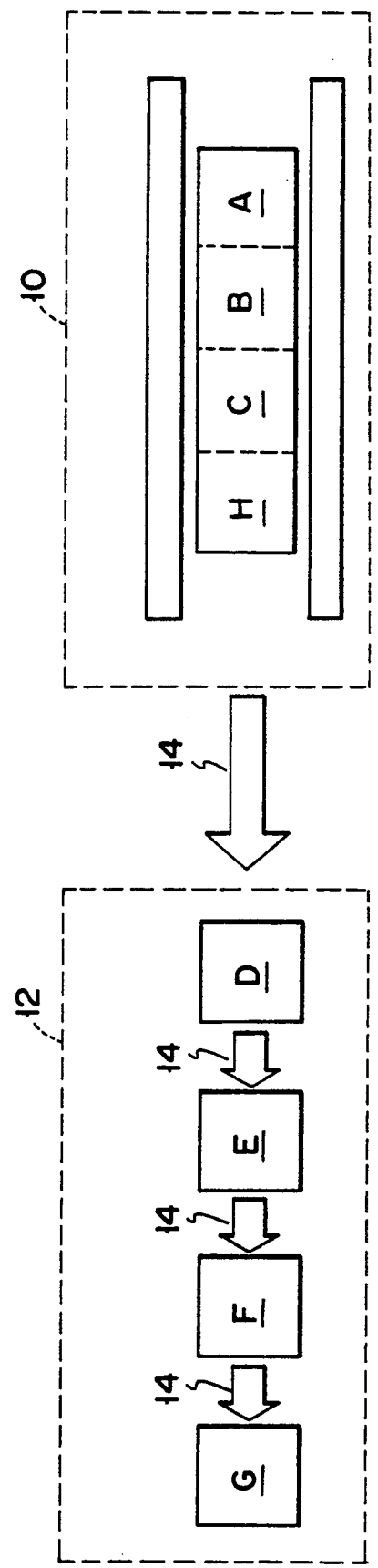
FIG. 5 is a block diagram showing examples of dies in blocks in FIG. 4.

FIG. 5 shows examples of dies in the punching steps block 10 and the bending steps block 12. In the punching steps block 10, a progressive die using a lead frame as a belt plate is employed. Referring to FIG. 5, reference symbols A, B, C, and H respectively denote blocks corresponding to the step blocks A), B), C), and H) in the prior art. In the bending steps block 12, single dies are used after a semiconductor device is separated from a lead frame in the step H). Referring to FIG. 5, reference symbols D, E, F, and G respectively denote blocks corresponding to the step blocks D), E), F), and G) in the prior art. In the bending steps block 12, conveyance of a workpiece between the single dies is performed by the convey means 14.

Figure 6:
FIG. 6 is a view showing a progressive die used in a punching steps block.
Figure 7:
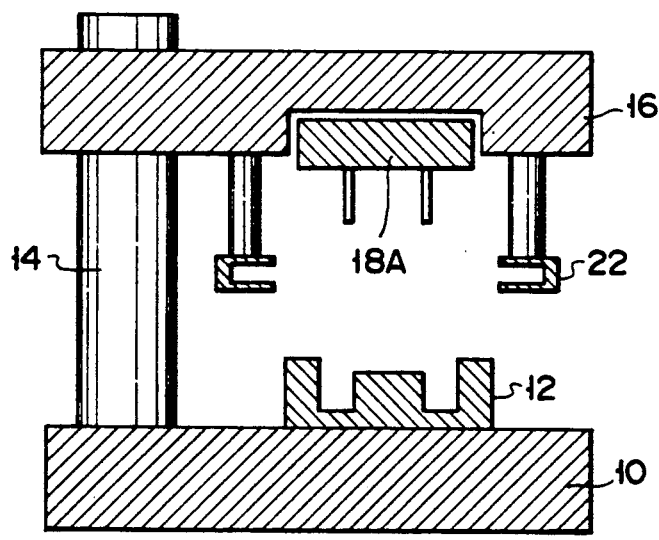
FIG. 7 is a sectional view taken along a line 7—7 in FIG. 6.
Figure 8:
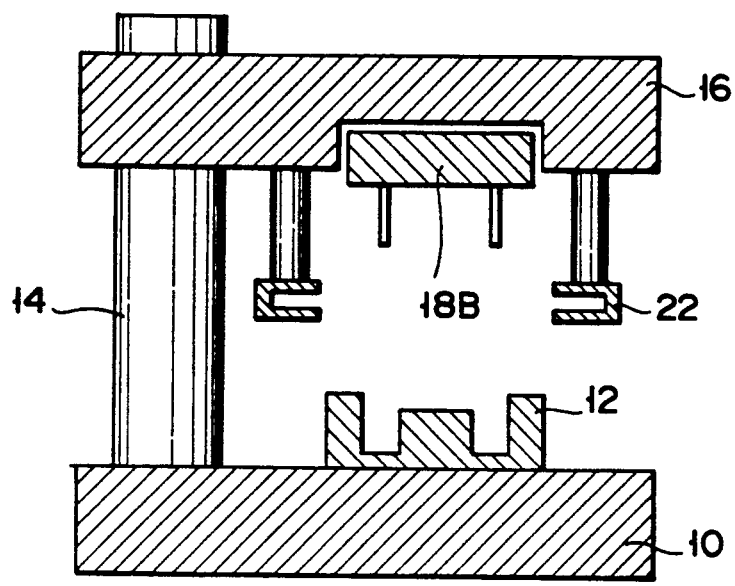
FIG. 8 is a sectional view taken along a line 8—8 in FIG. 6.
Figure 9:
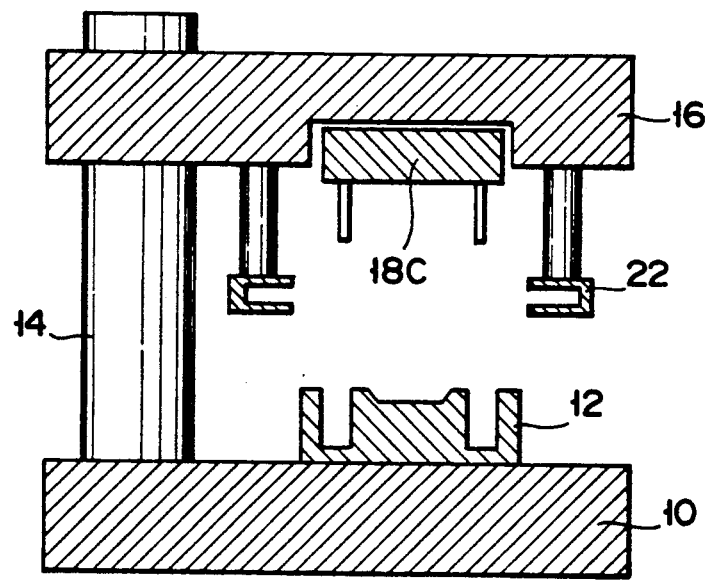
FIG. 9 is a sectional view taken along a line 9—9 in FIG. 6.
Figure 10:
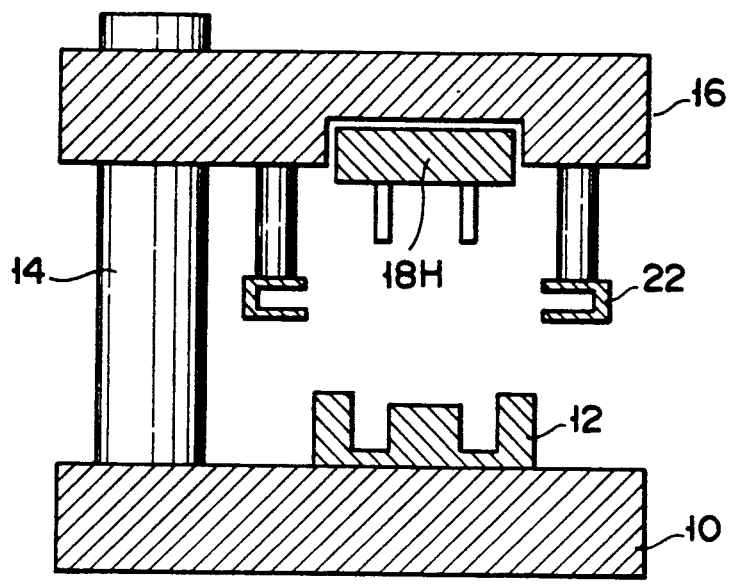
FIG. 10 is a sectional view taken along a line 10—10 in FIG. 6.

FIG. 6 shows a progressive die used in the punching steps block 10. FIG. 7 is a sectional view taken along a line 7—7 in FIG. 6. FIG. 8 is a sectional view taken along a line 8—8 in FIG. 6. FIG. 9 is a sectional view taken along a line 9—9 in FIG. 6. FIG. 10 is a sectional view taken along a line 10—10 in FIG. 6.

As shown in FIGS. 6 to 10, a die 12 held in a die holder 10. The shape of the die 12 varies in the respective steps. More specifically, a portion shown in FIG. 7 corresponds to the step A); a portion in FIG. 8, the step B); a portion in FIG. 9, the step C), and a portion in FIG. 10, the step H).

Figure 1:
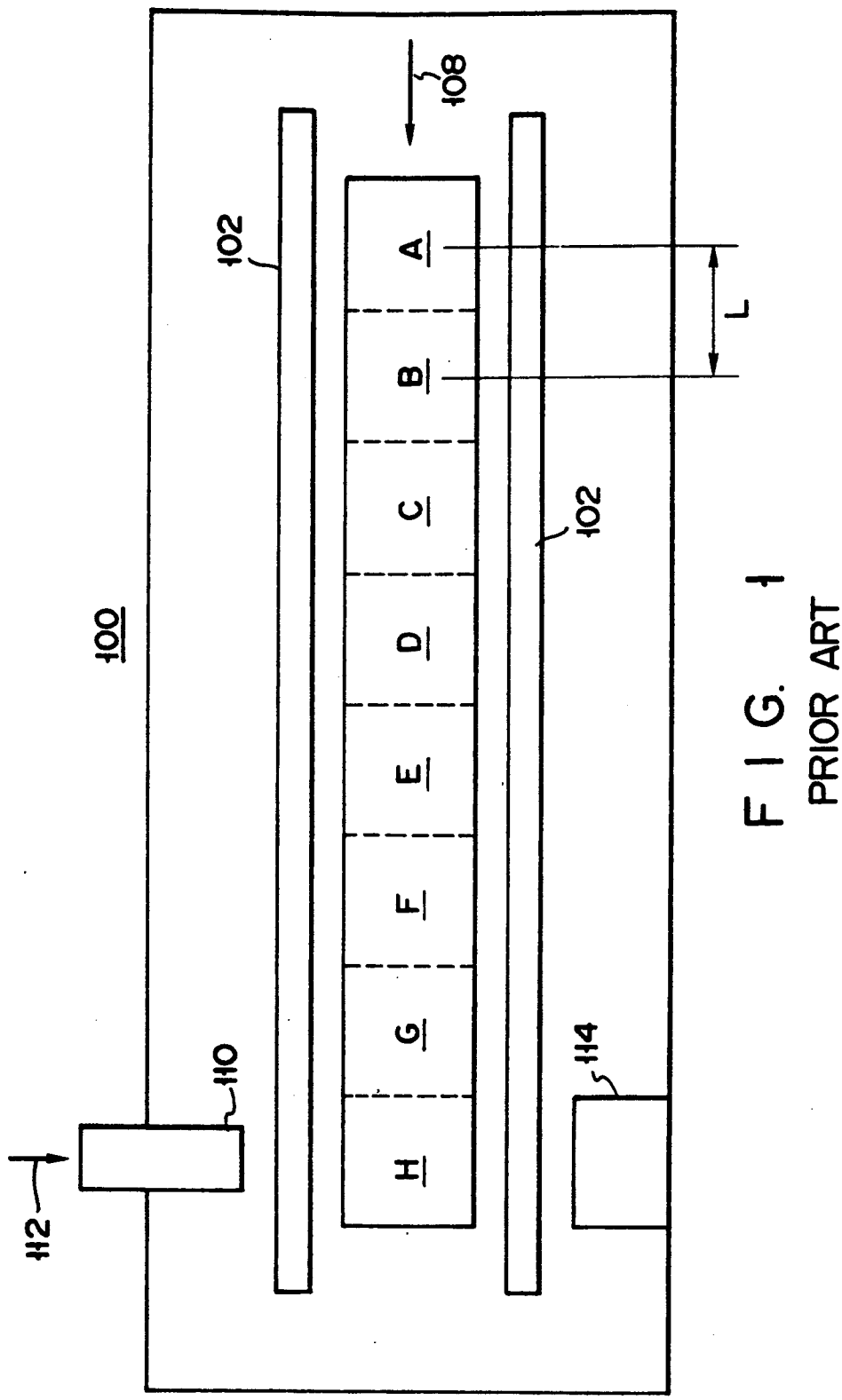
FIG. 1 is a block diagram showing a schematic arrangement of a conventional forming apparatus.
Figure 2:
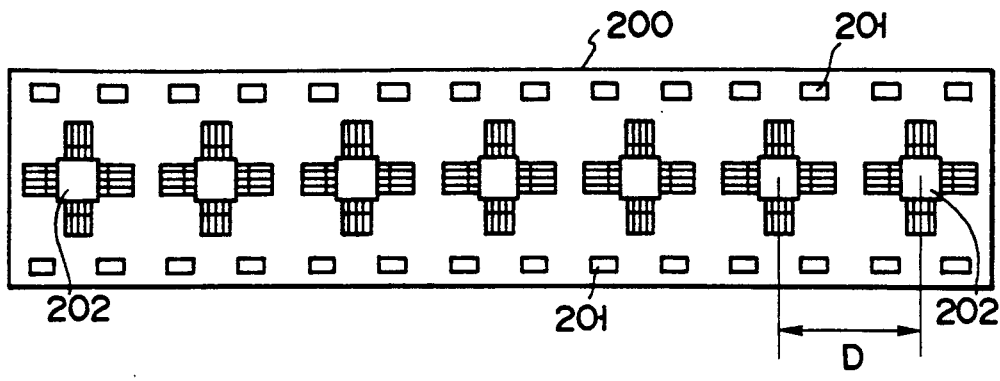
FIG. 2 is a plan view showing a lead frame.
Figure 3A:
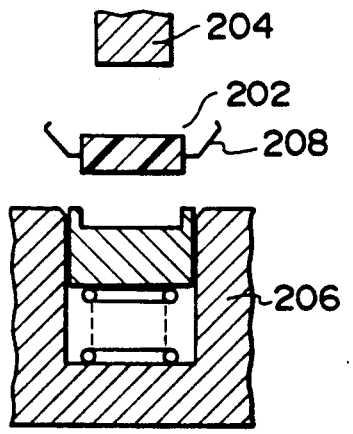
FIGS. 3A and 3B are views showing a sequence of butt bending.
Figure 3B:
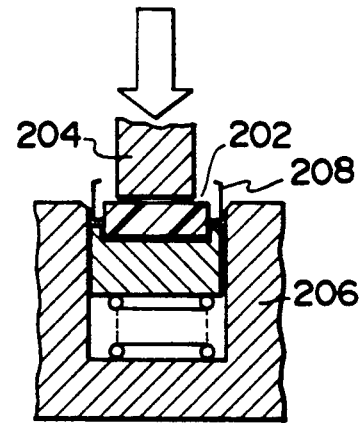

Guide posts 14 are attached to the die holder 10. A punch holder 16 is fitted on these guide posts 14 to constitute a dieset in which the movement of the punch holder 16 is restricted by the guide posts 14. Punches 18A, 18B, 18C, and 18H having different shapes in the respective steps are held in the punch holder 16. Convey rails 22 supported by springs 20 are attached to the punch holder 16. In the progressive die having such an arrangement, a lead frame 200 shown in FIG. 2 is inserted in a direction to advance from the punch 18A to the punch 18H and is fed forward along the convey rails 22.

The single dies used in the bending steps block 12 will be described below with reference to FIGS. 11 to 19.

Figure 11:
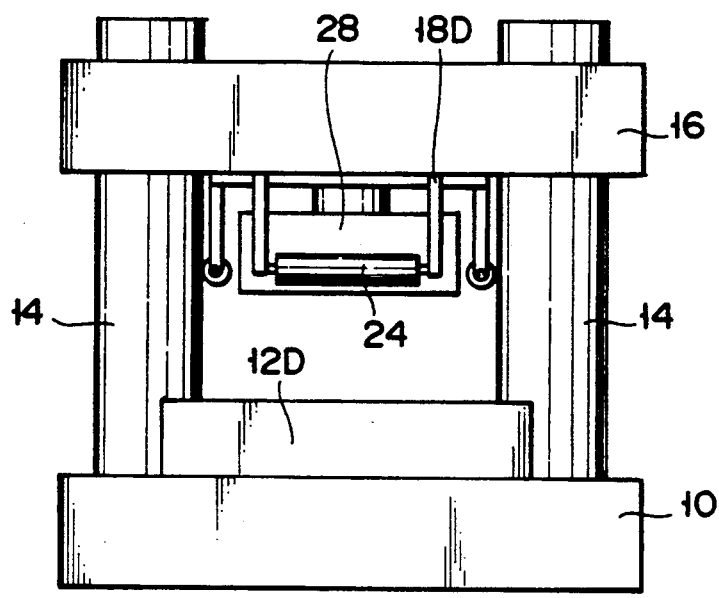
FIG. 11 is a view showing a single die used in a step D)
Figure 12:
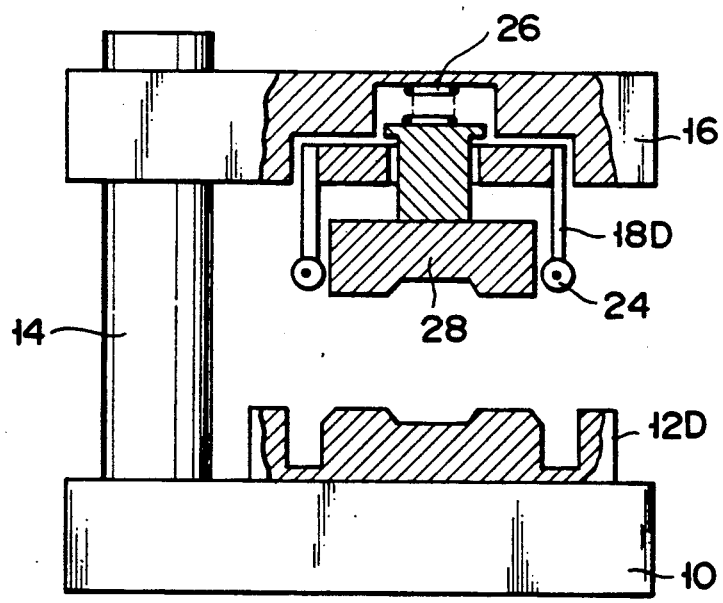
FIG. 12 is a partial sectional view of the die in FIG. 11 viewed from a different direction.

FIG. 11 shows the single die used in the step D). FIG. 12 is a partial sectional view of the single die viewed from a different direction. As shown in FIGS. 11 and 12, a die 12D is mounted in a die holder 10. Guide posts 14 are attached to the die holder 10. In addition, a punch holder 16 is fitted on the guide posts 14 to constitute a dieset. A punch 18D is mounted on the punch holder 16. Rollers 24 are arranged on the distal end of the punch 18D. Lead bending is performed by the rollers 24. In a conventional forming apparatus, since a distance L between the step blocks is too small to insert such rollers 24 between the blocks, lead bending by means of rollers cannot be realized. However, in the present invention, since each bending step is performed by a corresponding single die, a large distance can be ensured between the step blocks. Instead of using the method of butt bending or the like, therefore, lead bending can be performed by a method of bending leads while rotating the rollers 24, in which no excessive force acts on the leads. With this method, the chance of damaging leads can be reduced. A knockout 28 supported by a spring 26 is attached to the punch holder 16. When leads are to be bent, the knockout 28 serves to fix a semiconductor device, separated from a lead frame, between the die 12D and the punch 18D.

FIG. 13 shows the single die used in the step E). FIG. 14 is a partial sectional view of the single die viewed from a different direction. The same reference numerals in FIGS. 13 and 14 denote the same parts as in FIG. 11, and only different portions will be described below. As shown in FIGS. 13 and 14, a die 12E is mounted in a die holder 10. Rollers 24 are attached to the distal end of a punch holder 16. A punch 18E supported by springs 30 is mounted on the punch holder 16. The punch 18E is supported on a punch base 31 by pivots 32 such that it can be moved on the pivots 32 in a direction to separate from the knockout 28. This movement is required in lead bending and will be described later.

Figure 15:
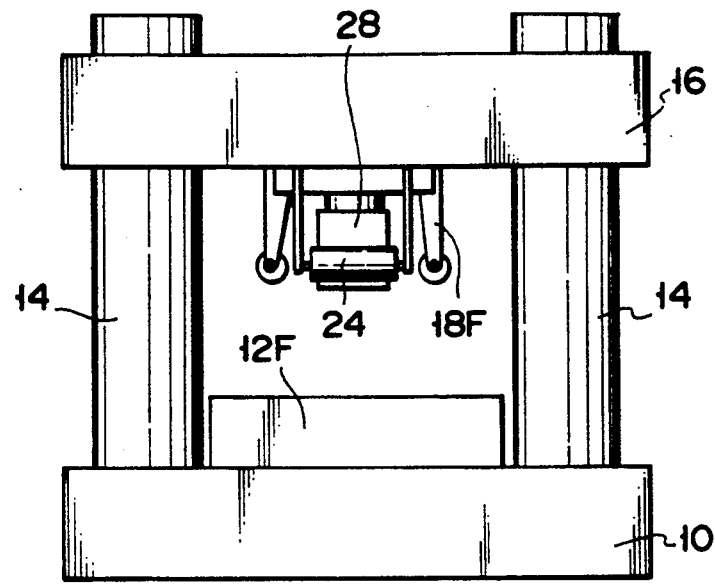
FIG. 15 is a view showing a single die used in a step F)
Figure 16:
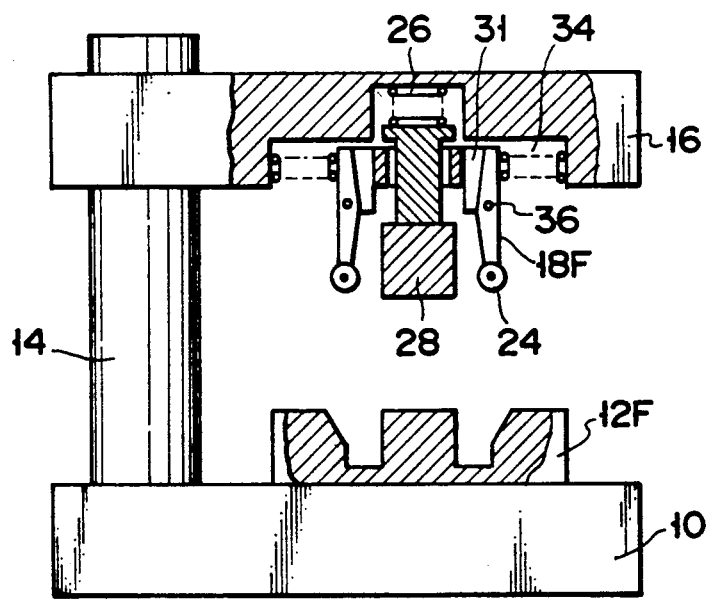
FIG. 16 is a partial sectional view of the die in FIG. 15 viewed from a different direction.

FIG. 15 shows the single die used in the step F). FIG. 16 is a partial sectional view of the single die viewed from a different direction. The same reference numerals in FIGS. 15 and 16 denote the same parts as in FIG. 11, and only different portions will be described below. As shown in FIGS. 15 and 16, a die 12F is mounted in a die holder 10. Rollers 24 are attached to the distal end of a punch holder 16. A punch 18F supported by springs 34 is mounted on the punch holder 16. The punch 18F is supported on a punch base 31 by pivots 36 such that it can turn on the pivots 36 in direction to separate from a knockout 28. This movement is also required in lead bending and will be described later, in addition to the step in FIG. 14.

Figure 17:
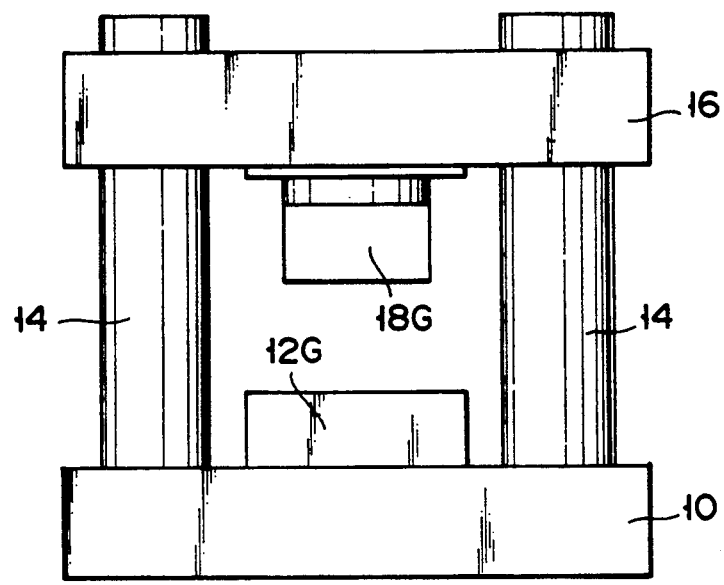
FIG. 17 is a view showing a single die used in a step G)
Figure 18:
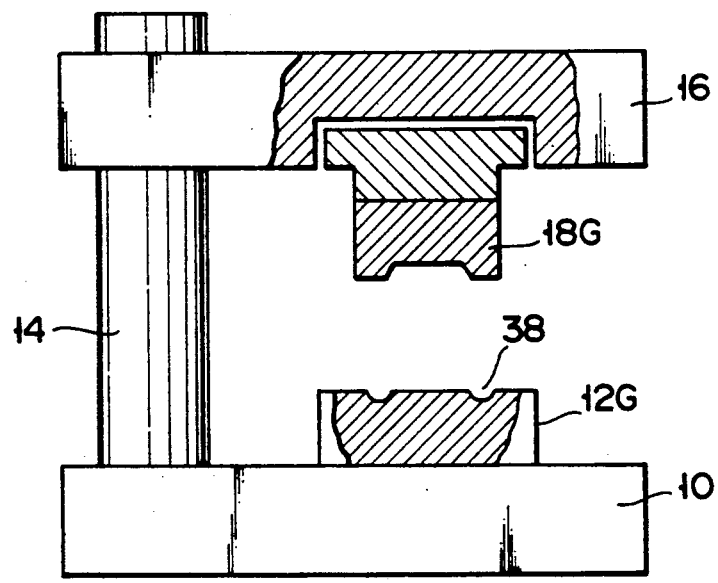
FIG. 18 is a partial sectional view of the die in FIG. 17 viewed from different direction.

FIG. 17 shows the single die used in the step G). FIG. 18 is a partial sectional view of the single die viewed from a different direction. The same reference numerals in FIGS. 17 and 18 denote the same parts as in FIG. 11, and only different portions will be described later. As shown in FIGS. 17 and 18, a die 12G having recesses 38 for curling leads is mounted in a die holder 10. In addition, a punch 18G is attached to a punch holder 16.

Figure 19:
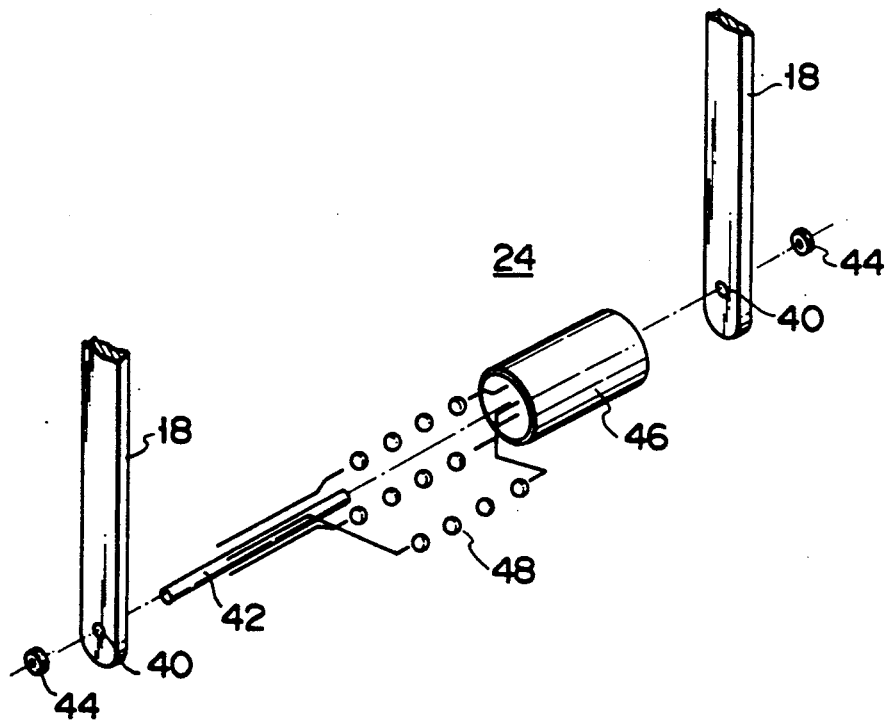
FIG. 19 is an exploded view of a roller.

FIG. 19 is an exploded view of the roller 24 for bending leads, which is shown in FIGS. 11 to 16. As shown in FIG. 19, shaft holes 40 are respectively formed in the distal end portions of a punch 18 for supporting the roller 24. A shaft 42 is fitted in the shaft holes 40. The shaft 42 and the punch 18 are fixed to each other by stop rings 44. A cylindrical member 46 covers the shaft 42. Bearings 48 ar inserted between the cylindrical member 46 and the shaft 42. If, for example, leads are brought into contact with the outer surface of the cylindrical member 46 and a force acts thereon, the bearings 48 inserted between the cylindrical member 46 and the shaft 42 slide. As a result, the cylindrical member 46 is rotated about the shaft 42. The roller 24 may be designed in such a manner.

The forming process to be performed by the above-described forming apparatus will be described below with reference to FIGS. 20A to 20L and FIGS. 21A to 21H.

FIGS. 20A to 20L show a sequence of steps in the forming process. FIGS. 21A to 21H are views each showing the movement of a die in each step. The same reference numerals in FIGS. 21A to 21H denote the same parts as in FIGS. 6 to 18.

Figure 20A:
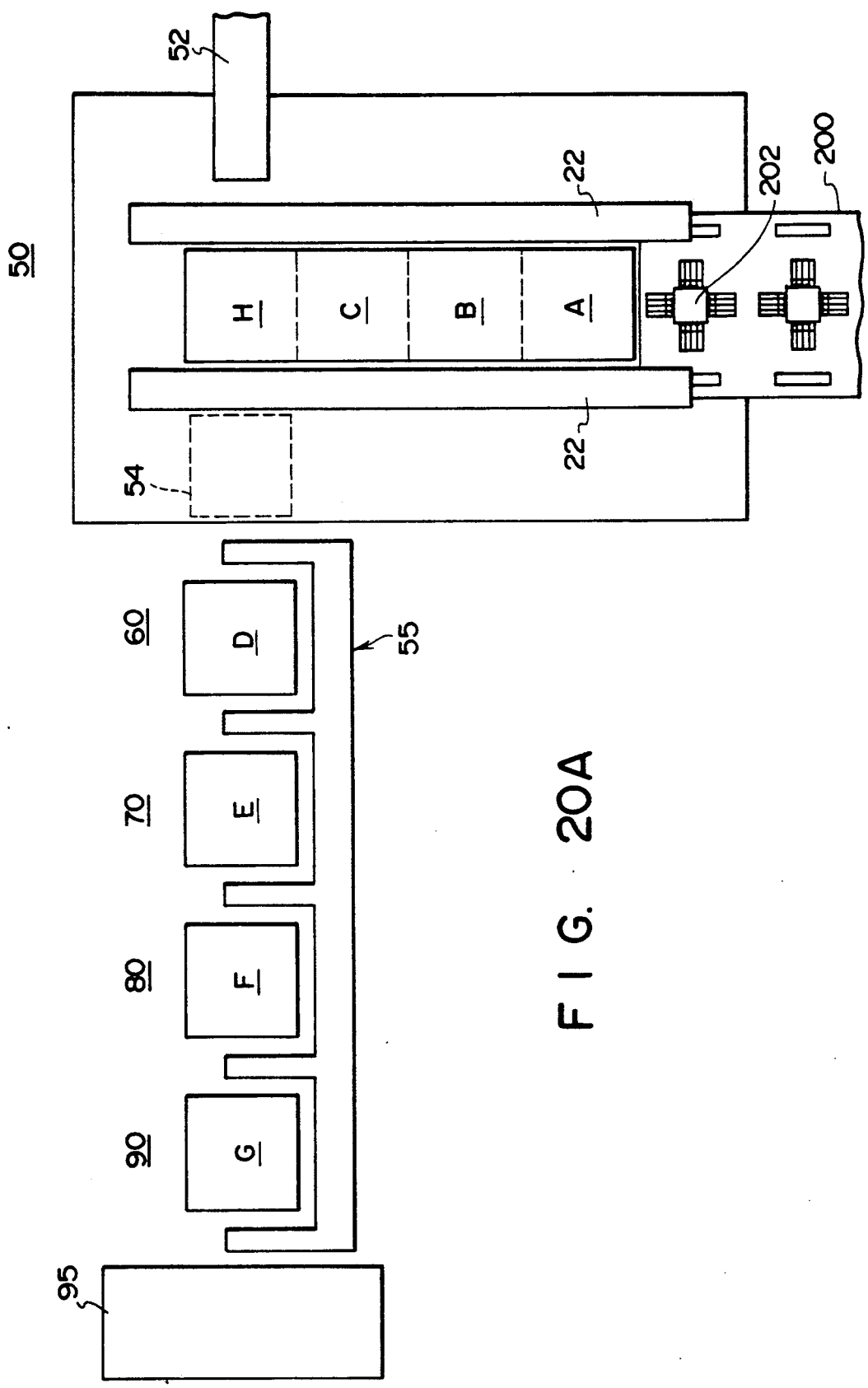

As shown in FIG. 20A, the lead frame 200 having the semiconductor devices 202 shown in FIG. 2 is inserted in the convey rails 22 of a progressive die 50 for performing punching steps.

Figure 21A:
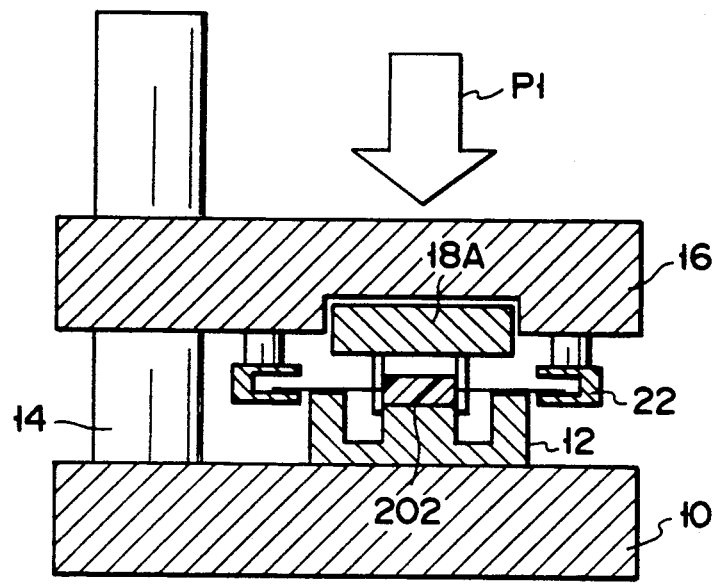

As shown in FIG. 20B, the semiconductor device 202 mounted on the leading end of the lead frame 200 is fed to the step A). Resin burrs 300 of the lead frame 200 are removed. FIG. 21A shows the movement of the die at this time. As shown in FIG. 21A, a pressure P1 is applied to the punch holder 16, and the holder 16 is moved downward toward the die 12. As a result, the burrs 300 are removed by the punch 18A.

Figure 20C:
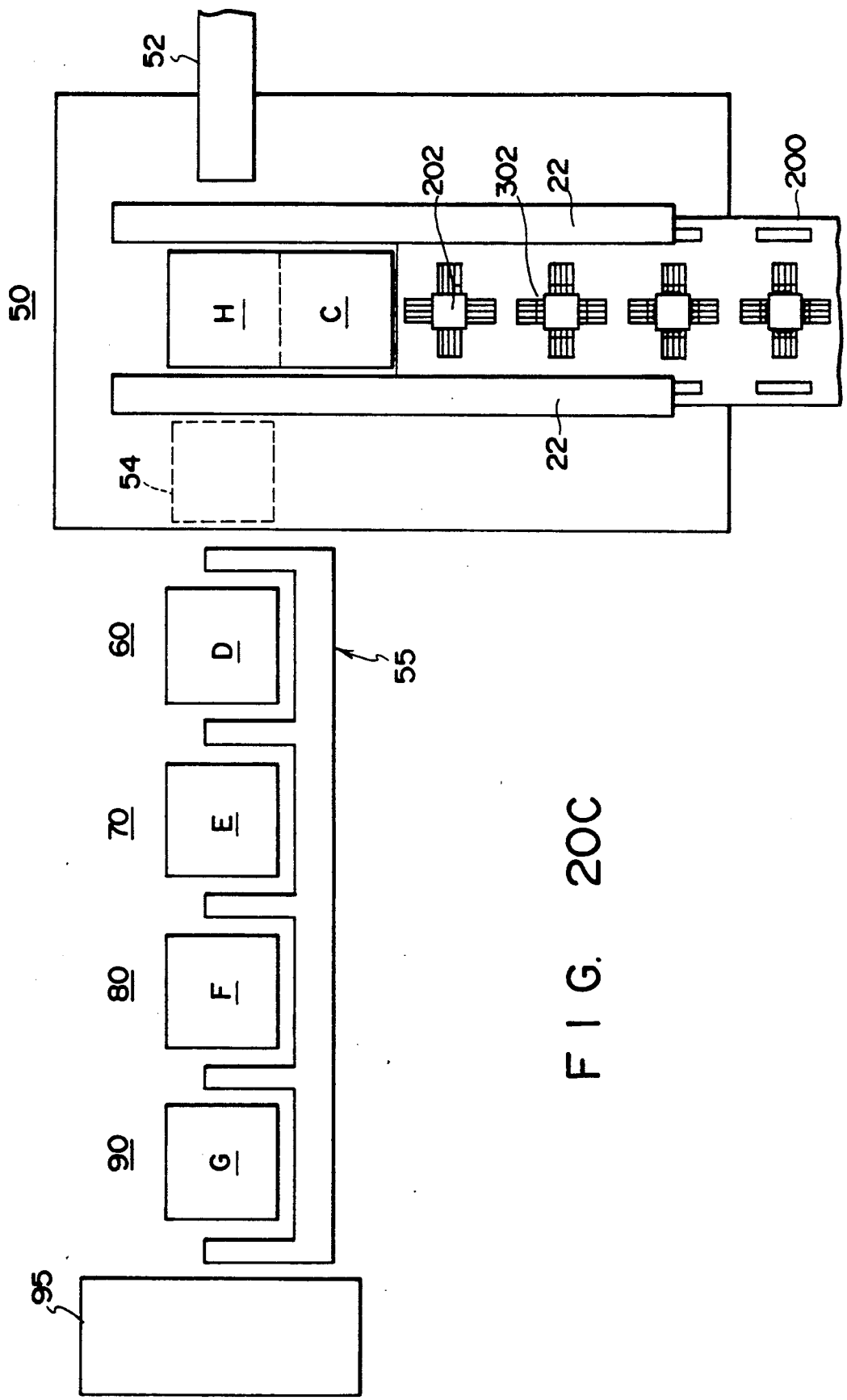
Figure 21B:
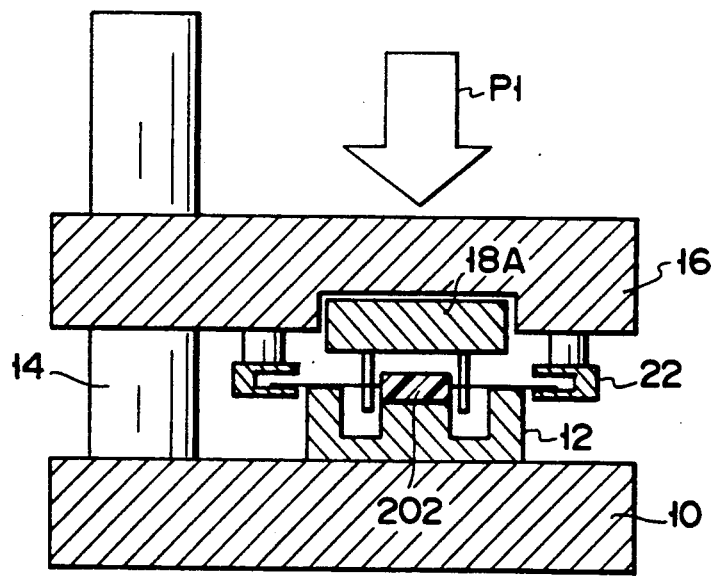

As shown in FIG. 20C, the semiconductor 202 is fed to the step B). In this step, dams 302 are cut from the lead frame 200. FIG. 21B shows the movement of the die at this time. As shown in FIG. 21B, the pressure P1 is applied to the punch holder 16, and the holder 16 is moved downward toward the die 12. As a result, the dams 302 are cut by the punch 18B.

Figure 20D:
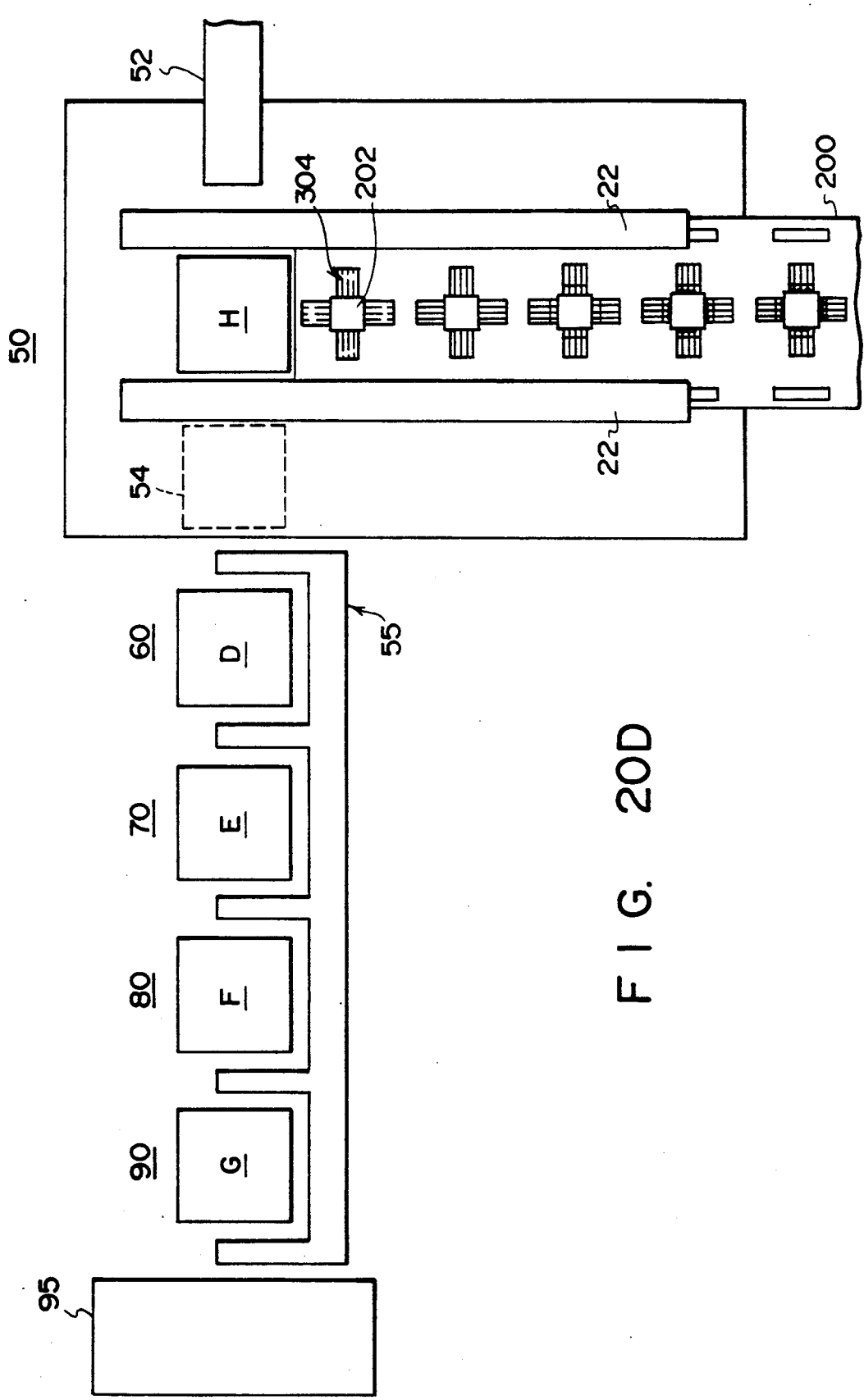

As shown in FIG. 20D, the semiconductor 202 is fed to the step C). In this step, the leads of the lead frame 200 are cut as indicated by reference numeral 304, and the length of each outer lead is determined. As FIG. 21C shows the movement of the die at this time, when the punch holder 16 is lowered toward the die 12, the leads are cut by the punch 18C.

Figure 20E:
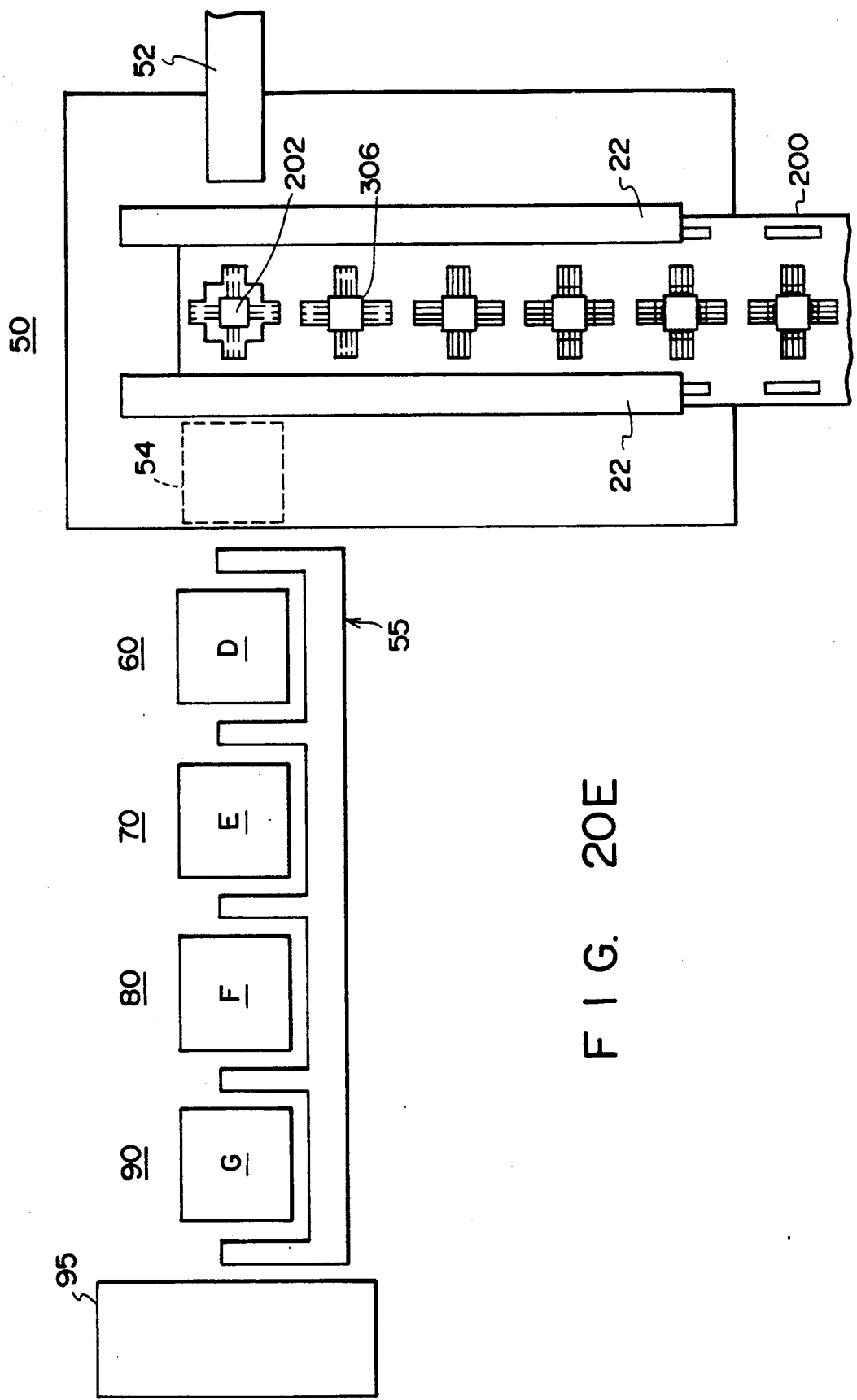

As shown in FIG. 20E, the semiconductor device 202 is fed to the step H). In this step, a tie-bar 306 is cut to separate the semiconductor device 202 from the lead frame 200. As FIG. 21D shows the movement of the die at this time, when the punch holder 16 is lowered toward the die 12, the tie-bar 306 is cut by the punch 18H.

Figure 20F:
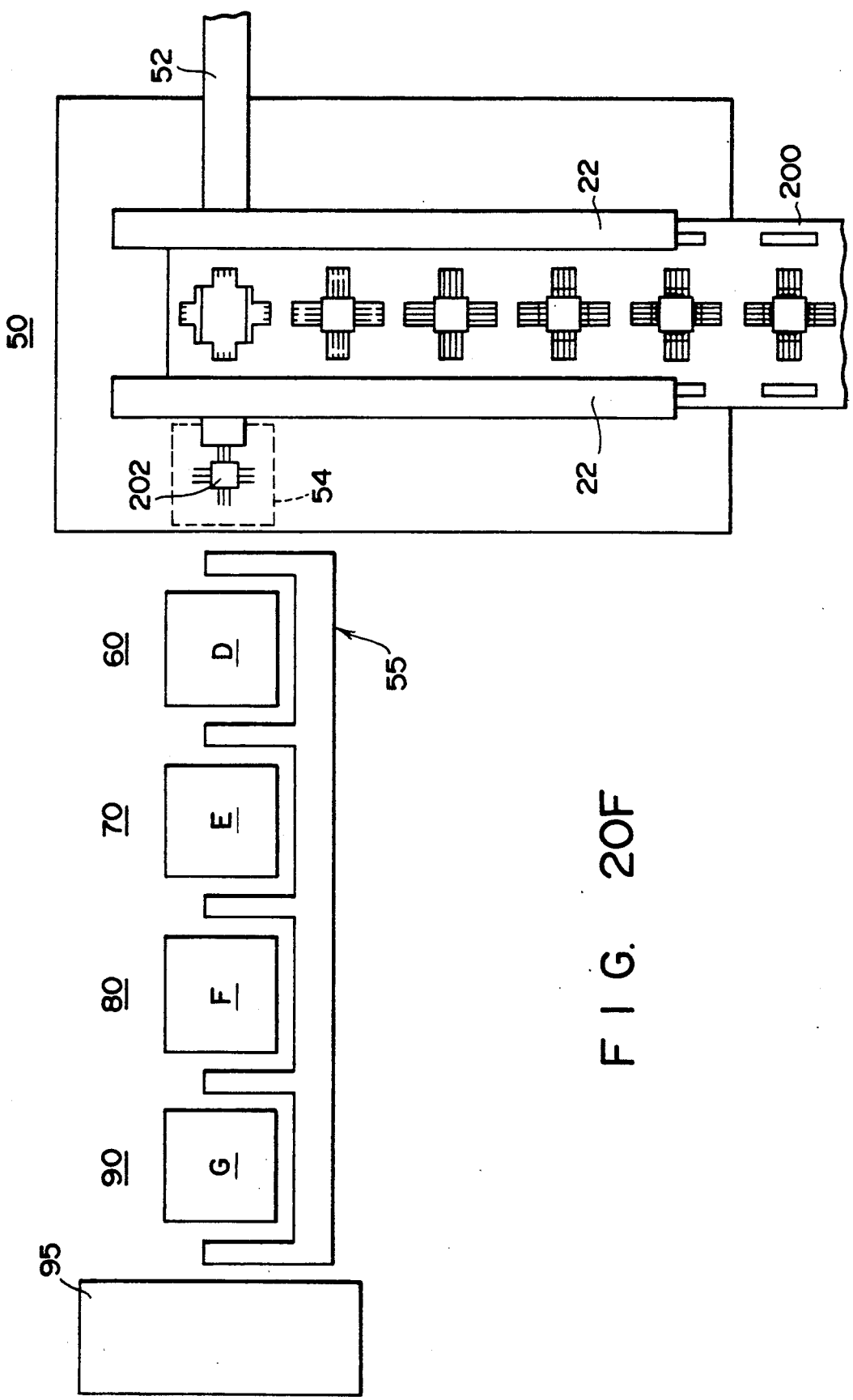

As shown in FIG. 20F, the semiconductor device 202 separated from the lead frame 200 is pushed by a push rod 52 to be fed to an unloader 54 of the progressive die 50.

Figure 20G:
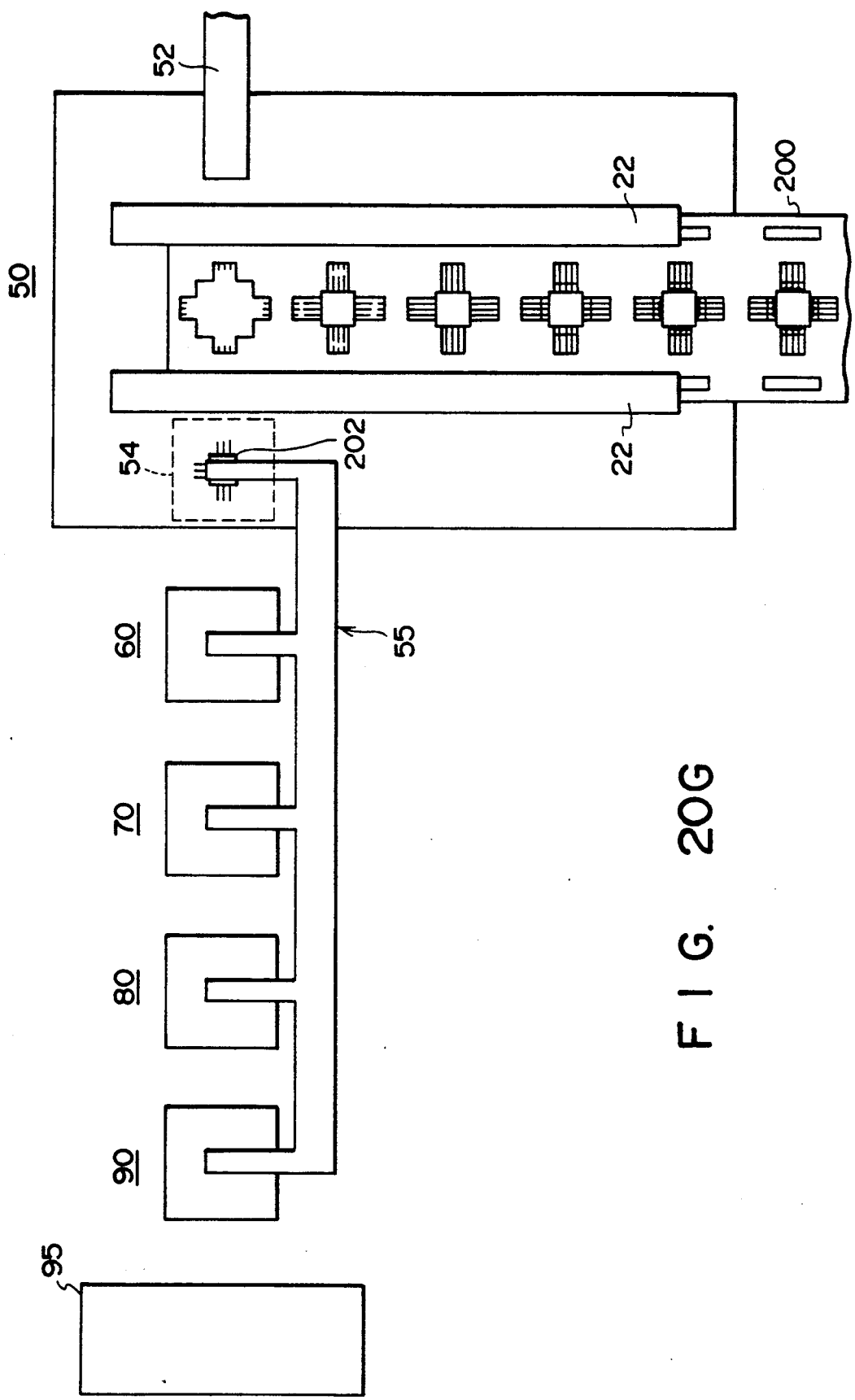
Figure 201:
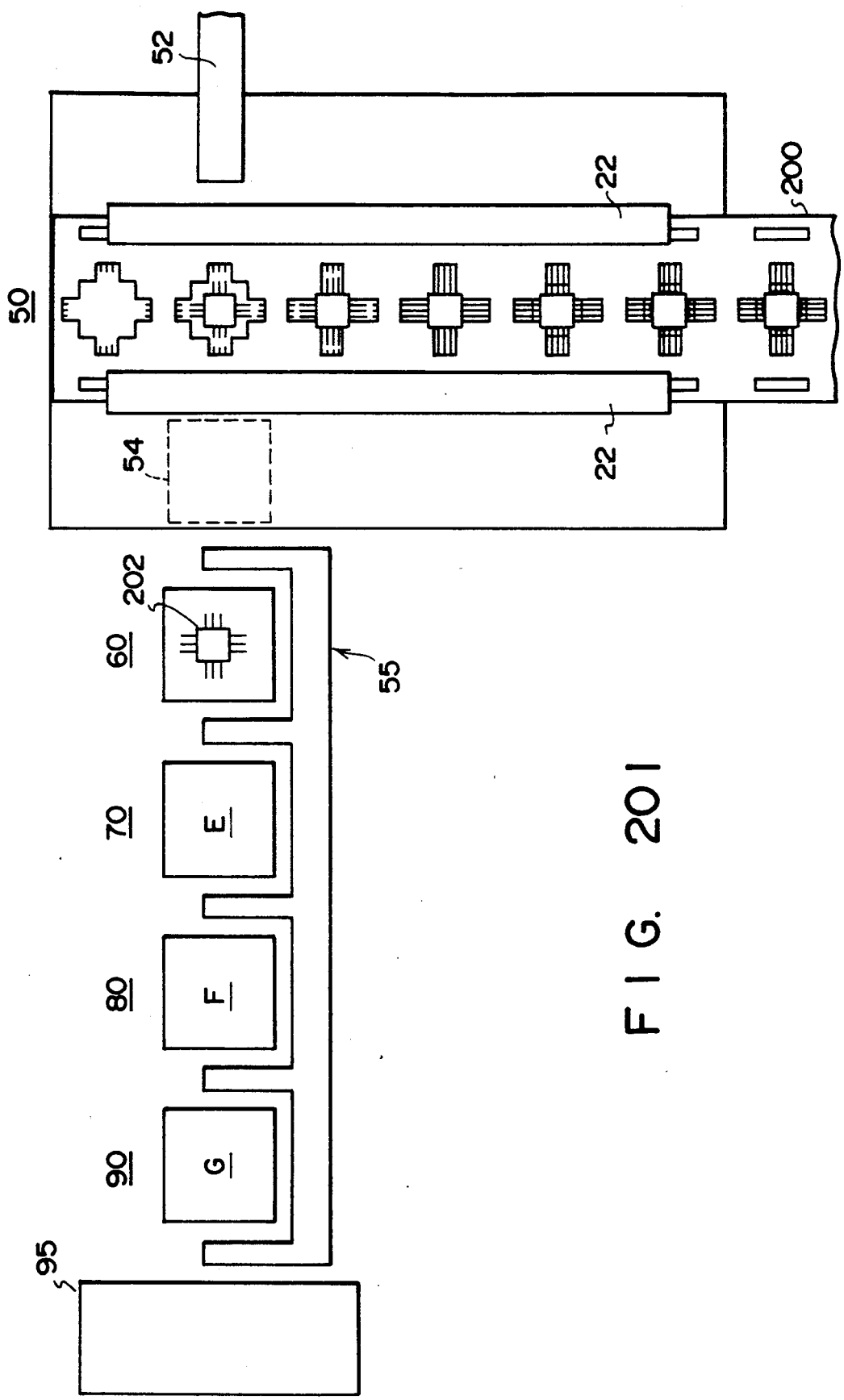

As shown in FIG. 20G, a convey unit 55 is moved to the unloader 54 to hold the semiconductor device 202.

The convey unit 55 then conveys the semiconductor device 202 to a first single die 60 for performing a bending step, as shown in FIG. 20H.

Figure 21E:
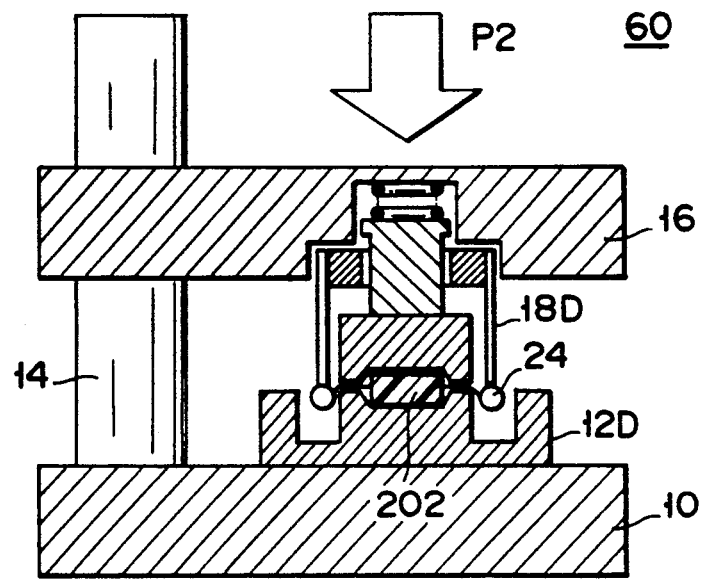

As shown in FIG. 20I, the step C is performed in the first single die 60. The distal end portions of the leads of the semiconductor device 202 are then slightly bent by the rollers 24 attached to the distal end of the punch 18D, as shown in FIG. 21E. In this case, the punch holder 16 is moved downward toward the die 12D by a pressure P2. The pressure P2 can be reduced to a value lower than the pressure P1 applied to the progressive die. With this reduction in pressure, the chance of damaging the leads can be reduced in lead bending. If this lead bending is performed by using the rollers 24 as shown in FIG. 21E, the chance of damaging the leads can be further reduced.

Figure 20J:
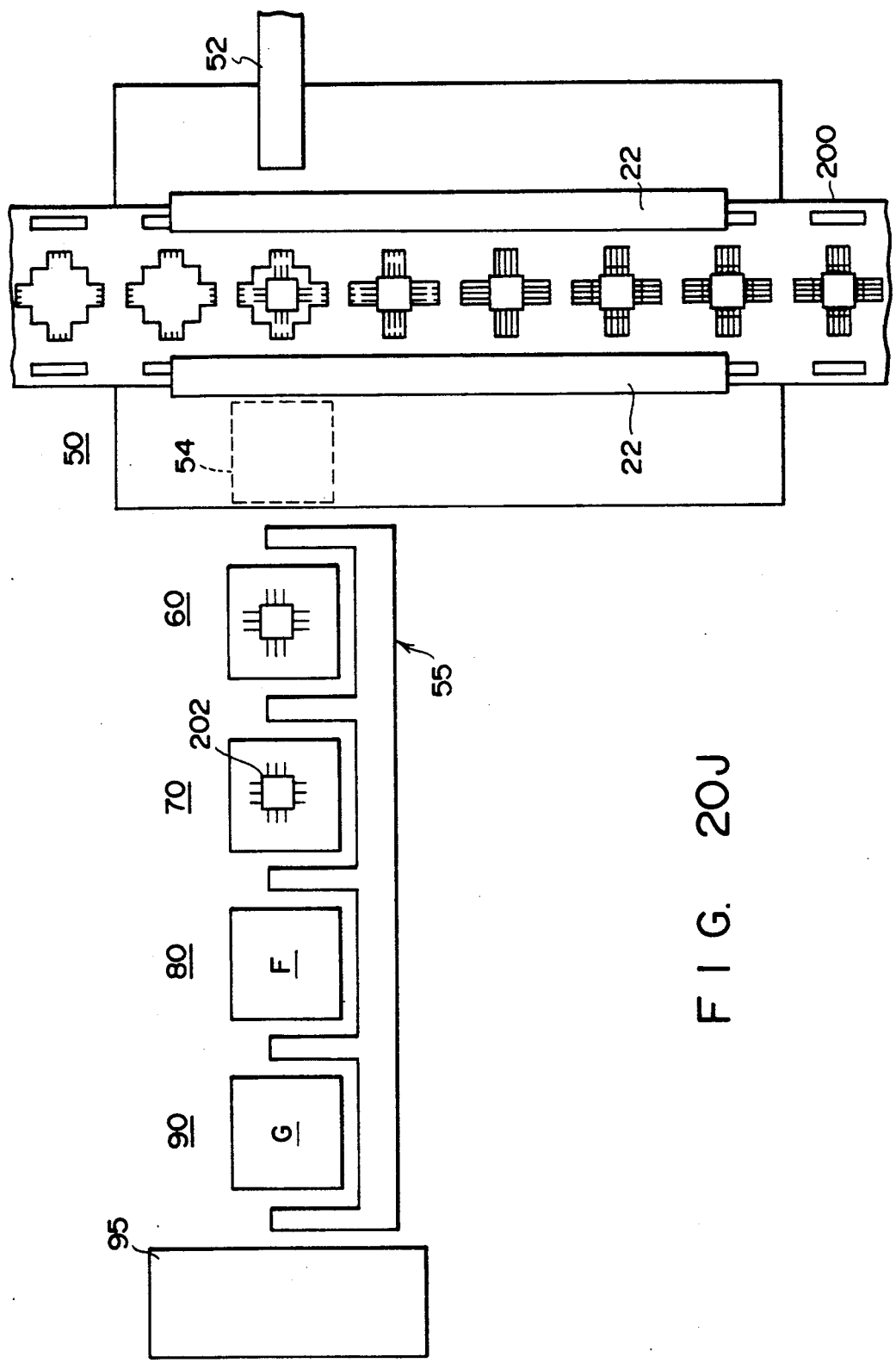
Figure 21F:
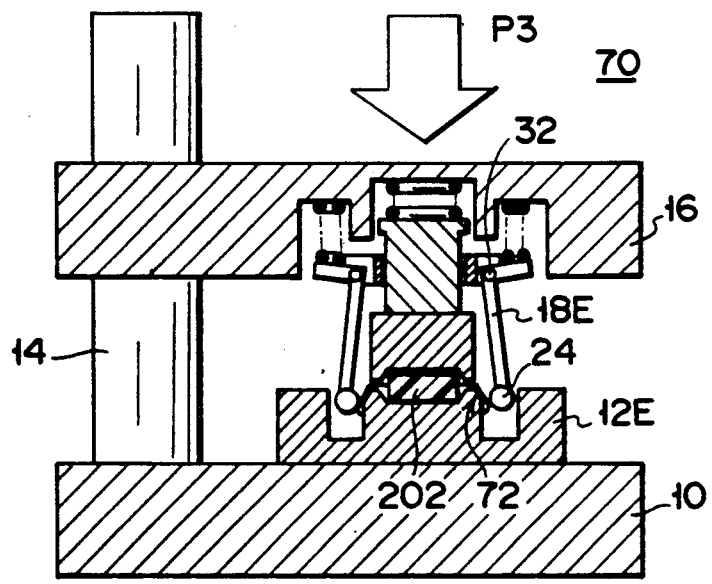

Subsequently, as shown in FIG. 20J, the semiconductor device 202 is conveyed to a second single die 70 by the convey unit 55. The die 70 is used to perform the step D). As shown in FIG. 21F, the outer leads are bent at angles of 40° to 60° by the rollers 24 attached to the distal end of the punch 18E. The step of bending the outer leads at acute angles before they are bent at right angles is called pre-bending. This pre-bending is performed in such a manner that the outer leads are clamped between the rollers 24 and inclined side surfaces 72 formed on the die 12E. At this time, the rollers 24 turn on the pivots 32 and slide along the inclined side surfaces 72 in directions to separate from the semiconductor device 202. A pressure P3 applied to the punch holder 16 in this step may be set to be equal to the pressure P2 applied to the first die 70.

Figure 20K:
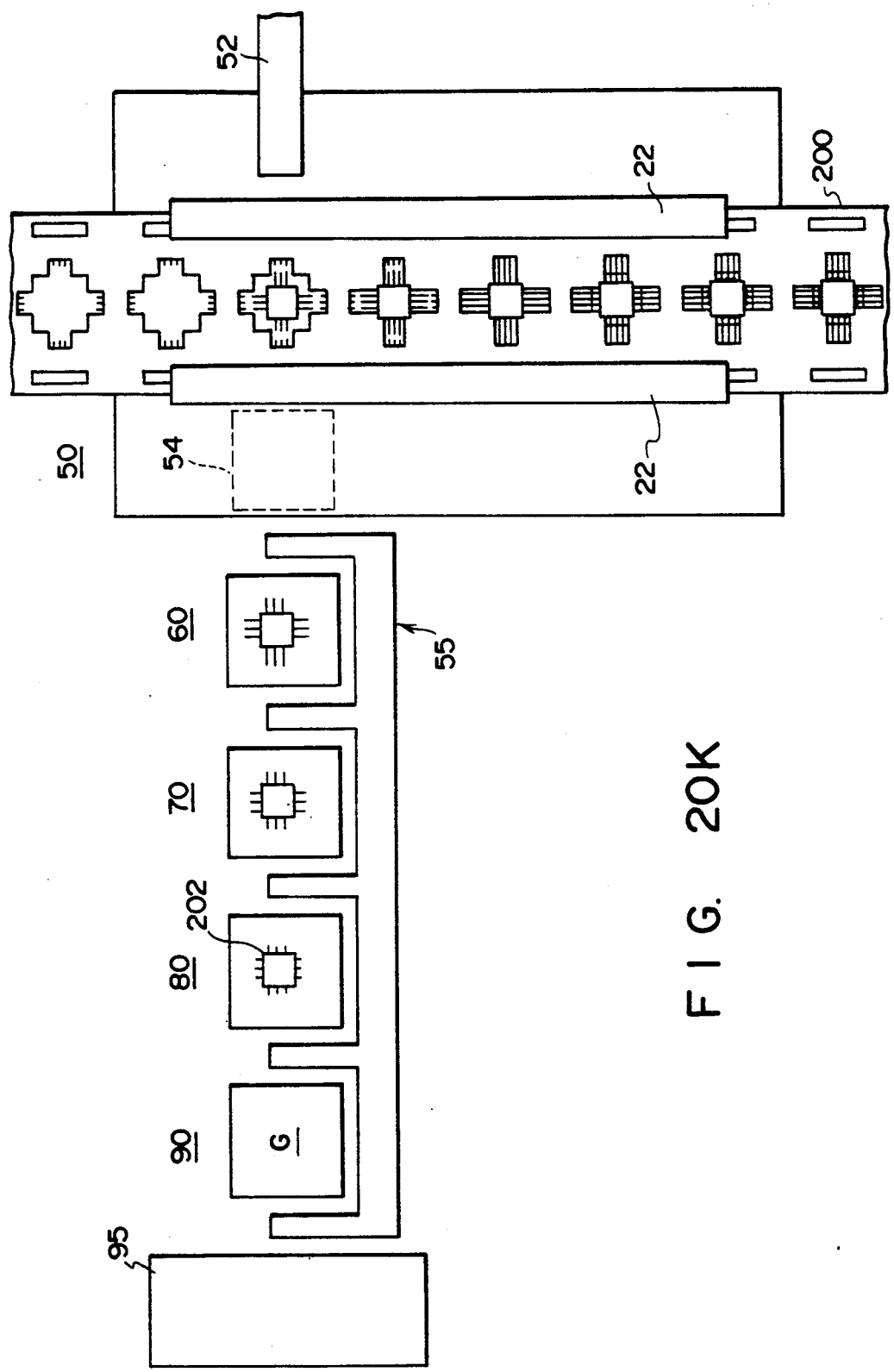

As shown in FIG. 20K, the semiconductor device 202 is conveyed to a third single die 80 by the convey unit 55. This die 80 is used to perform the step E). As shown in FIG. 21G, the outer leads are bent at right angles by the rollers 24 attached to the distal end of the punch 18F. In this right-angle bending, the rollers 24 turn on the pivots 36 and slide along inclined side surfaces 82 formed on the die 12F toward the semiconductor device 202, thus bending the outer leads toward the semiconductor device 202. A pressure P4 applied to the punch holder 16 in this step may be set to be equal to the pressure P2 applied to the first die 70.

Figure 20L:
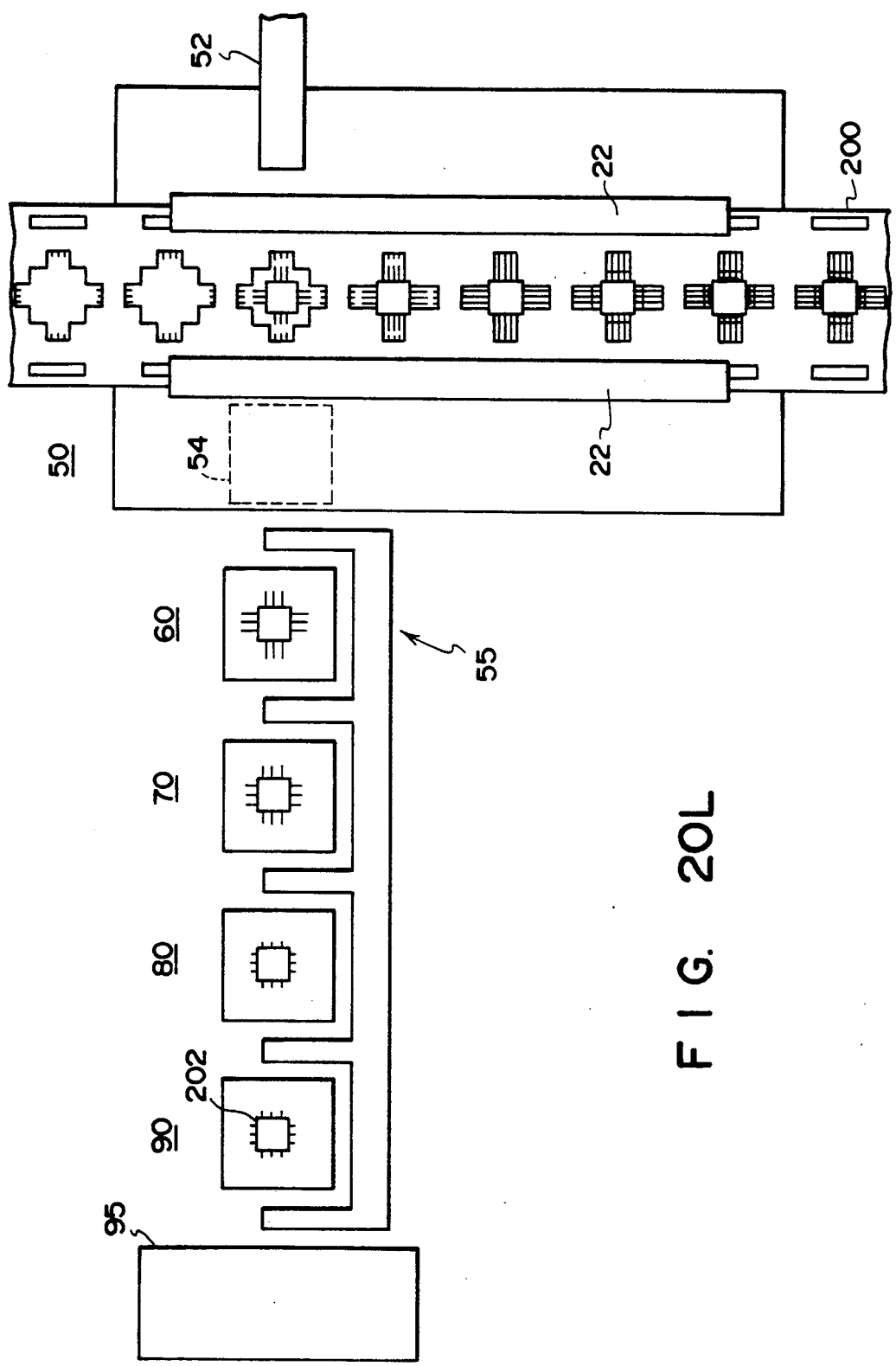

As shown in FIG. 20L, the semiconductor deice 202 is conveyed to a fourth single die 90 by the convey unit 55. This die 90 is used to perform the step F). As shown in FIG. 21H, when the semiconductor device 202 is pushed by the punch 18G, the outer leads are bent along the recesses 38 formed in the die 12G. With this step, the outer leads are curled, and forming of the outer leads of the PLCC type semiconductor device is completed. A pressure P5 applied to the punch holder 16 in this step may be set to be equal to the pressure P2 applied to the first die 70. Thereafter, the completed device is conveyed to an unloader 95 by the convey unit 55 and is unloaded from the forming apparatus of the present invention.

Figure 22:
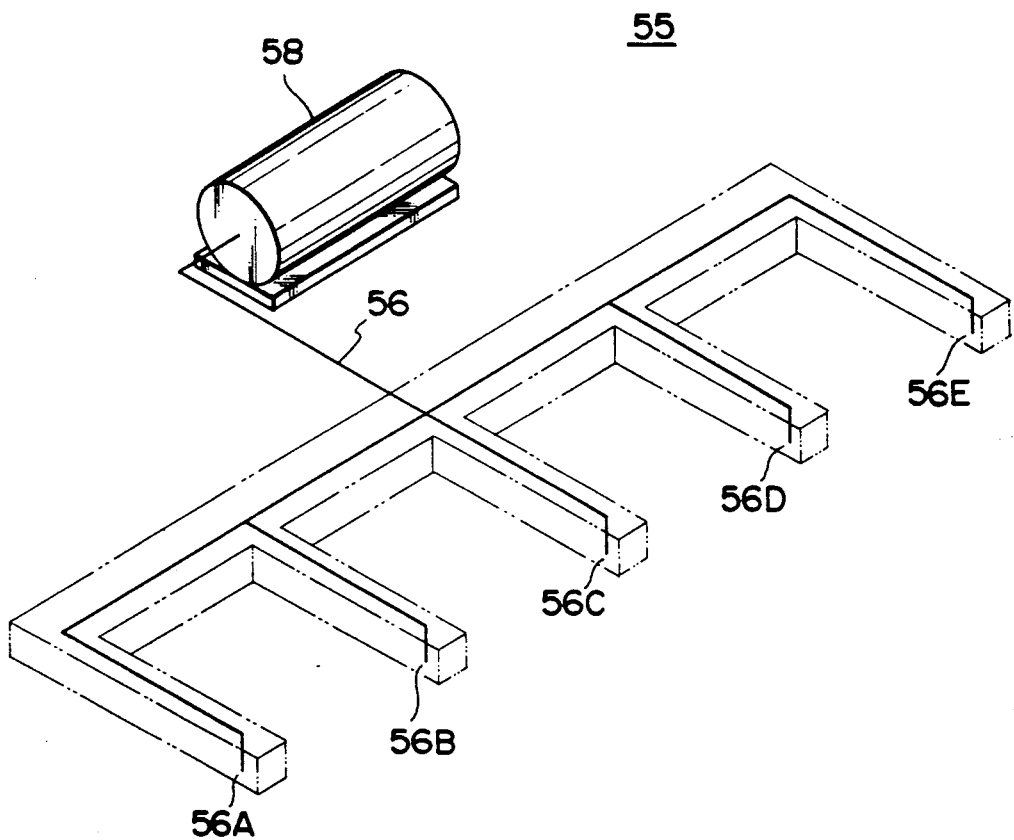
FIG. 22 is a perspective view showing a schematic arrangement of a convey unit.

FIG. 22 is a perspective view showing a schematic arrangement of the convey unit 55. As shown in FIG. 22, a pipe 56 is arranged in the convey unit 55. One end of the pipe 56 is connected to a vacuum pump 58. The other end of the pipe 56 is divided into a plurality of pipe portions which respectively communicate with the outside of the convey unit 55, thus constituting vacuum chuck portions 56A to 56E. For example, the convey unit 55 is realized by such vacuum chucks.

According to the outer lead forming system described above, since the dies are separately used in the bending steps and the punching steps, each die can be reduced in size and weight. This allows easy maintenance.

In addition, different pressures can be respectively applied in the bending steps and the punching steps. Especially in the bending steps, optimal pressures, i.e., pressures lower than pressures applied in the punching steps can be applied. As a result, the chance of damaging leads can be reduced. In addition, if leads are bent by using rollers in the bending steps, damage to the leads can be prevented, and the phenomenon in which a gap is formed between the proximal end of each outer lead and a seal resin of a semiconductor device can be prevented. Since leads are not easily damaged, peeled pieces of the plating layers of the leads are not easily formed.

Furthermore, as the size of each die is reduced, the frequency of replacement of dies is also reduced. In a conventional die having a large size, especially a punch at a die end portion and a die are greatly worn out, and hence the frequency of replacement of dies is high. This is because, in a large die, a large bending moment acts on a die end portion to cause considerable abrasion of a punch and the die. However, according to the present invention, since the size of each die is reduced, only a small bending moment acts on a die end portion. This is considered to be the reason for reduction in abrasion of a punch and a die.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An apparatus for manufacturing a semiconductor device from a lead frame having sprocket holes, a dam, a tie-bar, ad a workpiece having a lead and an attached resin burr, said apparatus comprising:

separating means for separating said workpiece from said lead frame and including resin burr cutting means for removing said resin burr from the workpiece, dam cutting means for removing said dam from the lead frame after removal of said resin burr, lead cutting means for cutting said lead to a determined length after said dam is removed, and a tie-bar cutting means for separating the work piece from the lead frame after said lead is cut to length;

lead forming means for forming said lead and including end bending means for bending an open end of said lead after said tie-bar is cut, pre-bending means for pre-bending said lead after said open end is bent, right-angle bending means for bending said lead substantially at right angles after said lead is pre-bent, and lead curling means for curling said lead after said lead is bent substantially at right angles;

first conveying means for conveying said workpiece successively to said resin burr cutting means, said dam cutting means, said lead cutting means, and said tie-bar cutting means; and second conveying means for conveying said workpiece successively to said open end bending means, said pre-bending means, said right-angle bending means, and said lead curling means.

2. An apparatus according to claim 1 wherein said separating means includes a progressive die.

3. An apparatus according to claim 1, wherein said lead forming means includes:
a first single die to provide said open end bending means;
a second single die to provide said pre-bending means;
a third single die to provide said right-angle bending means; and
a fourth single die to provide said lead curling means.

4. An appartus according to claim 3, wherein said first conveying means includes a conveyor rail for advancing said lead frame using said sprocket holes.

5. An apparatus according to claim 4, wherein said second conveying means includes a vacuum chuck.

6. An apparatus according to claim 3, wherein:
said resin burr cutting means includes a first punch;
said dam cutting means includes a second punch;
said lead cutting means includes a third punch;
said tie-bar cutting means includes a fourth punch;
said open end bending means includes a sixth punch;
said pre-bending means includes a sixth punch;
said right-angle bending means includes a seventh punch; and
said lead curling means includes an eighth punch.

7. An apparatus according to claim 6 wherein:
said fifth punch includes a first roller for pressing said lead;
said sixth punch includes a second roller for pressing said lead; and
said seventh punch includes a third roller for pressing said lead.

8. An apparatus according to claim 7, wherein:
said progressive die is operated under a first pressure to press said first, second third and fourth punches;
said first single die is operated under a second pressure to press said fifth punch;
said second single die is operated under a third pressure to press said sixth punch;
said third single die is operated under a fourth pressure to press said seventh punch; and
said fourth single die is operated under a fourth pressure to press said seventh punch; and
said fourth single die is operated under a fifth pressure to press said eighth punch;
said second pressure through fifth pressure being lower than said first pressure.

9. An apparatus according to claim 11, wherein said first conveying means advances said workpiece in a first direction, and said second conveying means advances said workpiece in a second direction different from said first direction.

10. An apparatus according to claim 9 further comprising slide means for sliding said workpiece from said first direction to said second direction.

11. An apparatus according to claim 10, wherein said slide means includes a push rod.

* * * * *

UNITED STATES PATENT AND TRADEMARK OFFICE
CERTIFICATE OF CORRECTION

PATENT NO. : 5,135,034
DATED : August 04, 1992
INVENTOR(S) : Mitsugu Miyamoto It is certified that error appears in the above-identified patent and that said Letters Patent is hereby corrected as shown below:

Claim 1, column 8, line 47, change "ad" to --and--.

Claim 4, column 9, line 18, change "appartus" to --apparatus--.

Claim 4, column 9, line 19, change "conveyor" to --convey--.

Claim 6, column 9, line 29, change "sixth" to --fifth--.

Claim 8, column 10, line 10, change "second" to --second,--.

Claim 8, column 10, lines 17 and 18, delete these lines in their entireties.

UNITED STATES PATENT AND TRADEMARK OFFICE
CERTIFICATE OF CORRECTION

PATENT NO. : 5,135,034 Page 2 of 2
DATED : August 4, 1992
INVENTOR(S) : Mitsugu Miyamoto It is certified that error appears in the above-indentified patent and that said Letters Patent is hereby corrected as shown below:

Signed and Sealed this

Second Day of November, 1993

Attest:

BRUCE LEHMAN

Attesting Officer     Commissioner of Patents and Trademarks